US012672402B2

(12) United States Patent
Iwasa et al.

(10) Patent No.: US 12,672,402 B2
(45) Date of Patent: Jun. 30, 2026

(54) LIGHT EMITTING DEVICE

(71) Applicant: NICHIA CORPORATION, Anan (JP)

(72) Inventors: Makiko Iwasa, Anan (JP); Yuji Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 909 days.

(21) Appl. No.: 17/757,918

(22) PCT Filed: Oct. 23, 2020

(86) PCT No.: PCT/JP2020/039837
§ 371 (c)(1),
(2) Date: Jun. 23, 2022

(87) PCT Pub. No.: WO2021/131287
PCT Pub. Date: Jul. 1, 2021

(65) Prior Publication Data
US 2023/0045870 A1 Feb. 16, 2023

(30) Foreign Application Priority Data
Dec. 24, 2019 (JP) .................................. 2019-233510

(51) Int. Cl.
*H10H 20/851* (2025.01)
*C09K 11/77* (2006.01)

(52) U.S. Cl.
CPC ... *H10H 20/8512* (2025.01); *C09K 11/77342* (2021.01); *C09K 11/77348* (2021.01); *C09K 11/7774* (2013.01)

(58) Field of Classification Search
CPC ........... H10H 20/8513; H10H 20/8512; H10H 20/825; C09K 11/77348; C09K 11/7774;
(Continued)

(56) References Cited

U.S. PATENT DOCUMENTS 9,276,180 B2 3/2016 Ishida et al.
9,349,664 B2 5/2016 Ishida et al.
(Continued)

FOREIGN PATENT DOCUMENTS

CN 106287552 A 1/2017
CN 107461686 A 12/2017
(Continued)

OTHER PUBLICATIONS

Xiaolang, Liu. "The red persistent luminescence of (Sr,Ca)AlSiN3:Eu2+ and mechanism different to SrAl2O4:Eu2+, Dy3+" APirl 2019 (Year: 2019).*

*Primary Examiner* — Jessica S Manno
*Assistant Examiner* — Victor Joseph Lasasso
(74) *Attorney, Agent, or Firm* — Hunton Andrews Kurth LLP

(57) ABSTRACT

The light emitting device includes a light emitting element having a dominant wavelength in a range of 430 nm or more and 500 nm or less, and a fluorescent material that is excited by light emitted from the light emitting element and has a light emission peak wavelength in a range of 507 nm or more and 660 nm or less, wherein the light emitting device emits light having a dominant wavelength in a range of 490 nm or more and 500 nm or less, wherein the light emitting device has an S/P ratio, which is the ratio of a luminous flux in photopic vision to a luminous flux in scotopic vision, being 6.5 or less, and wherein the light emitting device has a light emission intensity in the light emission peak wavelength of the light emitting element that is greater than that in the light emission peak wavelength of the fluorescent material.

10 Claims, 17 Drawing Sheets

(58) Field of Classification Search
CPC ................ C09K 11/00; C09K 11/0883; C09K
11/77347; C09K 11/02
See application file for complete search history.

(56) References Cited

U.S. PATENT DOCUMENTS

| | | | |
|---|---|---|---|
| 10,096,749 | B2 | 10/2018 | Takei |
| 10,374,132 | B2 | 8/2019 | Kumano et al. |
| 2014/0131753 | A1 | 5/2014 | Ishida et al. |
| 2015/0340577 | A1 | 11/2015 | Ishida et al. |
| 2016/0033103 | A1 | 2/2016 | Nakano et al. |
| 2016/0218255 | A1* | 7/2016 | Kim ...................... C09K 11/02 |
| 2016/0293808 | A1* | 10/2016 | Kim ................... H10H 20/8513 |
| 2016/0377240 | A1 | 12/2016 | Takei |
| 2017/0186920 | A1 | 6/2017 | Kumano et al. |
| 2017/0352787 | A1 | 12/2017 | Takei et al. |
| 2019/0035982 | A1 | 1/2019 | Takei |

FOREIGN PATENT DOCUMENTS

| | | | |
|---|---|---|---|
| JP | 2014112635 | A | 6/2014 |
| JP | 2016095998 | A | 5/2016 |
| JP | 2017017059 | A | 1/2017 |
| JP | 2017117912 | A | 6/2017 |
| JP | 2017220312 | A | 12/2017 |
| JP | 2019029084 | A | 2/2019 |

* cited by examiner

[FIG. 1]
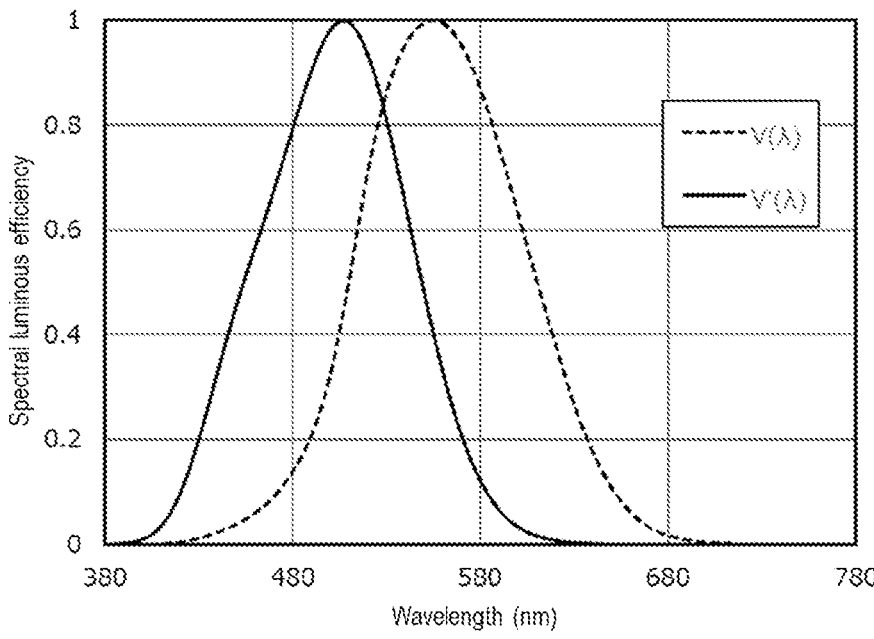

[FIG. 2]
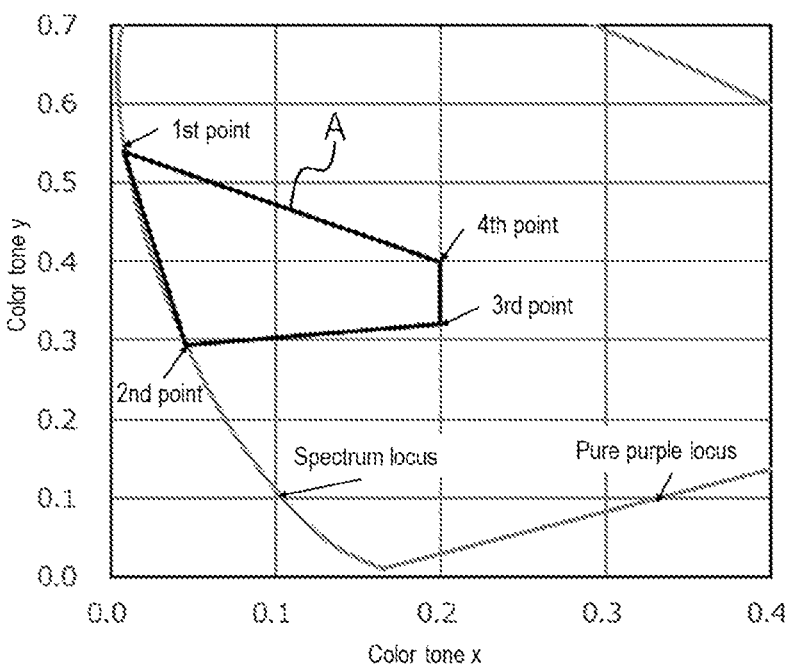

[FIG. 3]
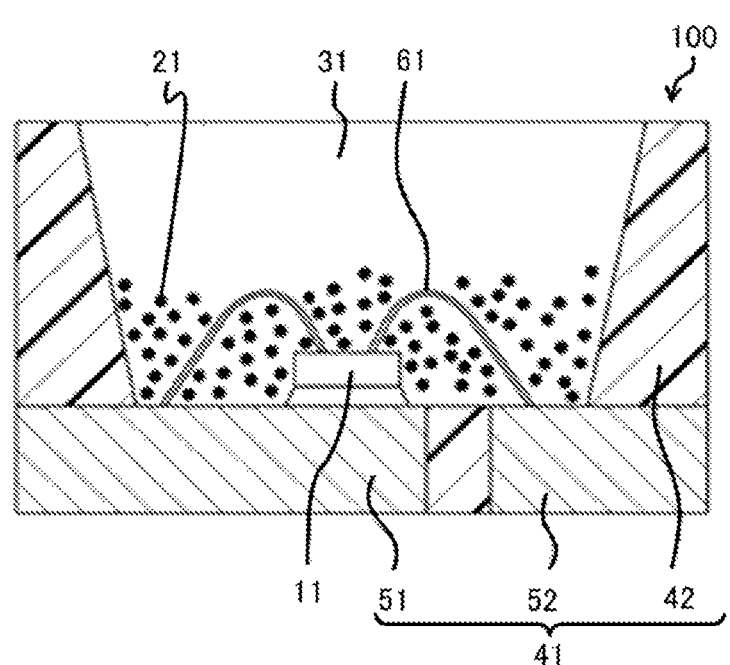

[FIG. 4A]
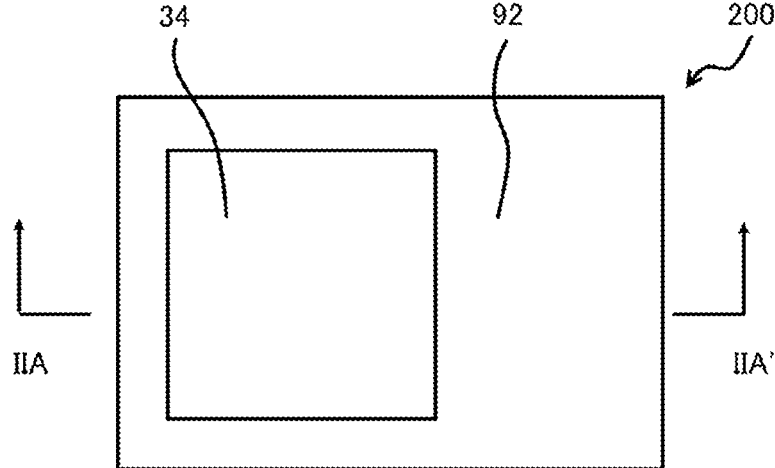

[FIG. 4B]
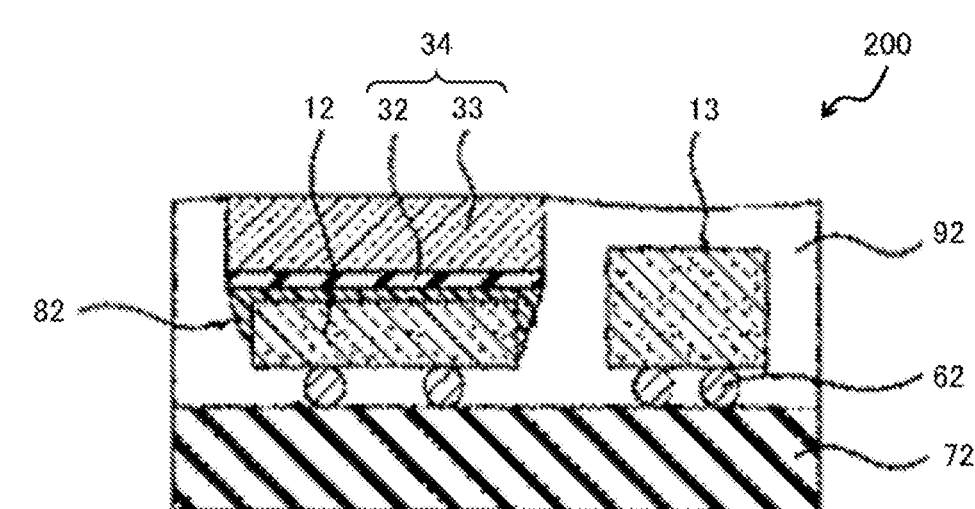

[FIG. 5]
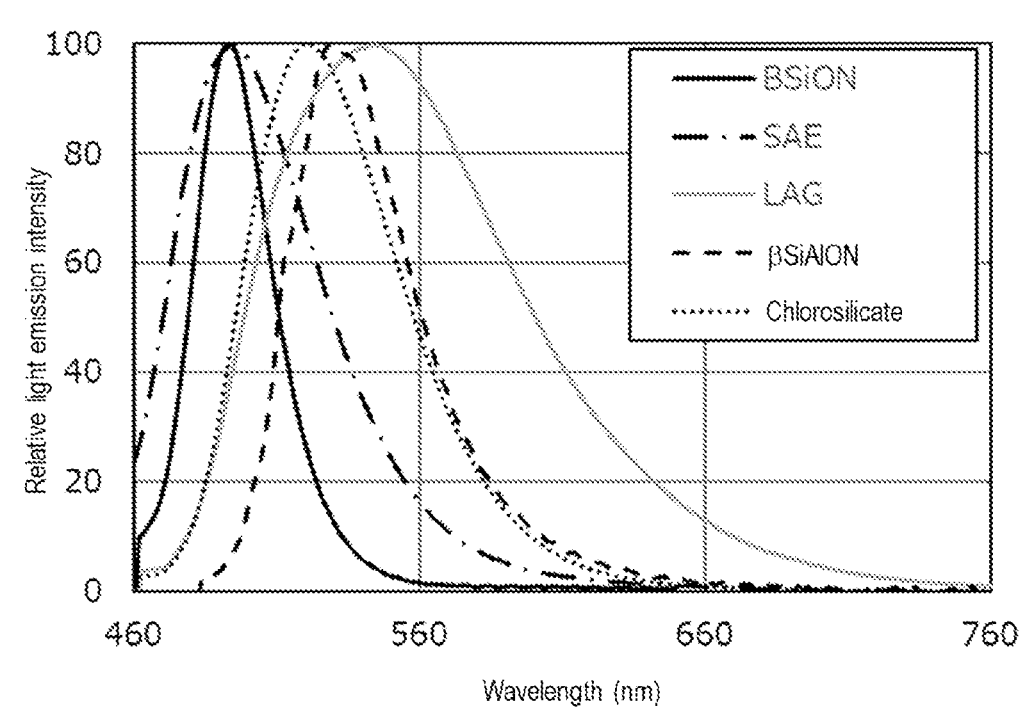

[FIG. 6]
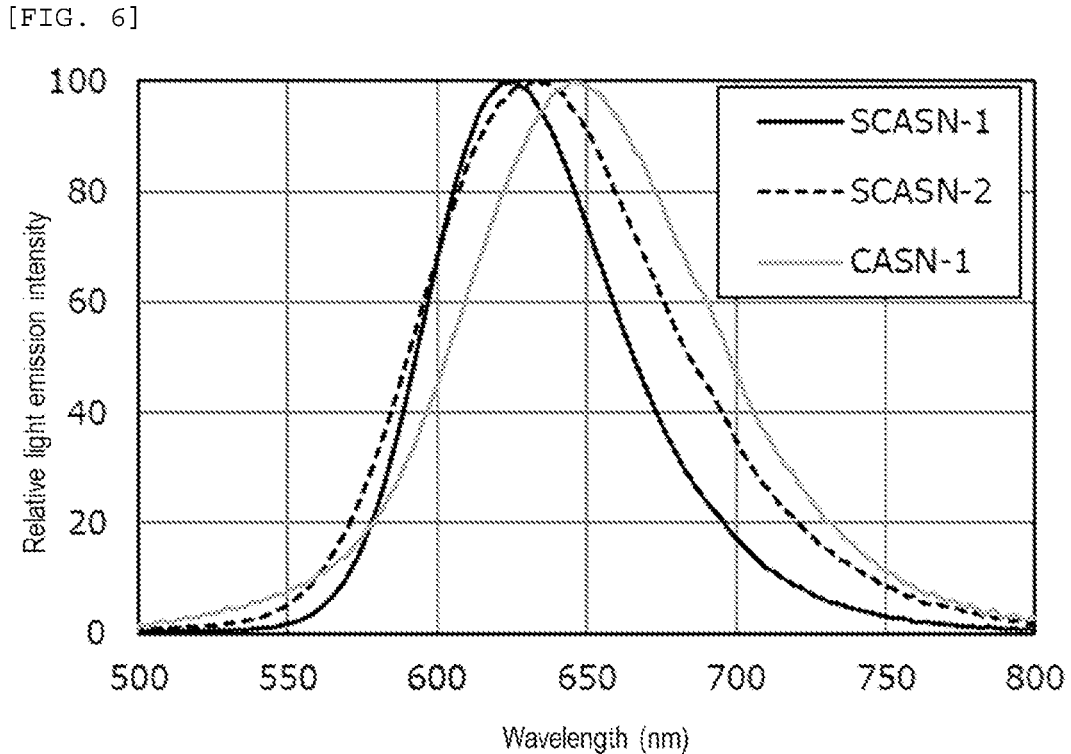

[FIG. 7]
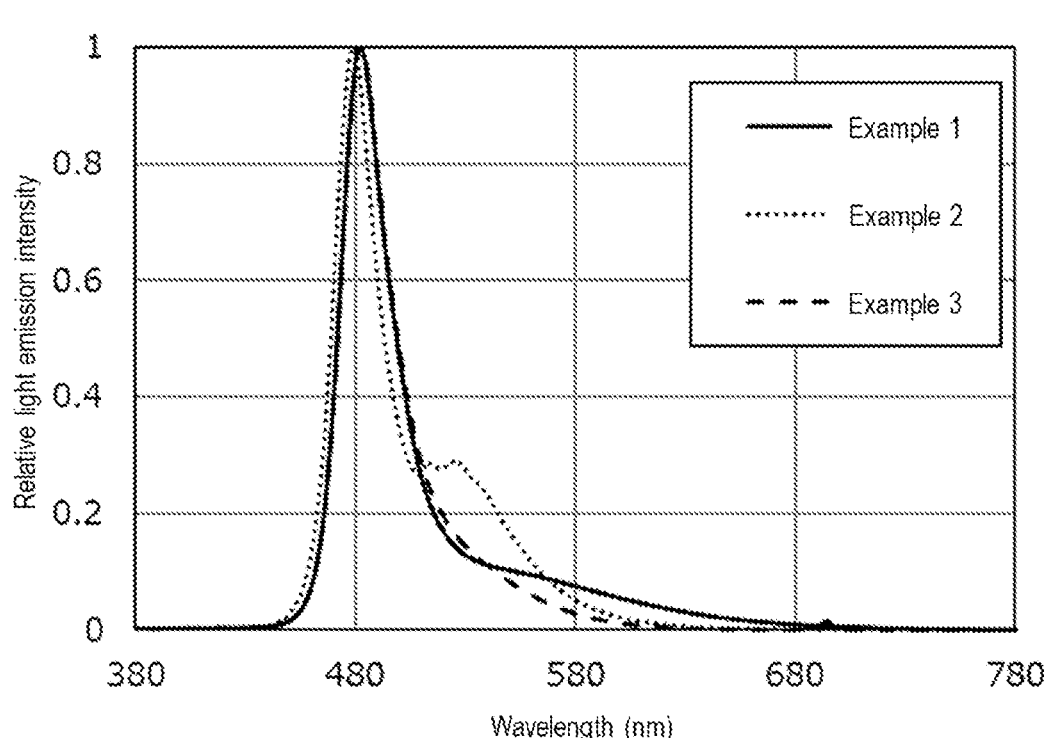

[FIG. 8]
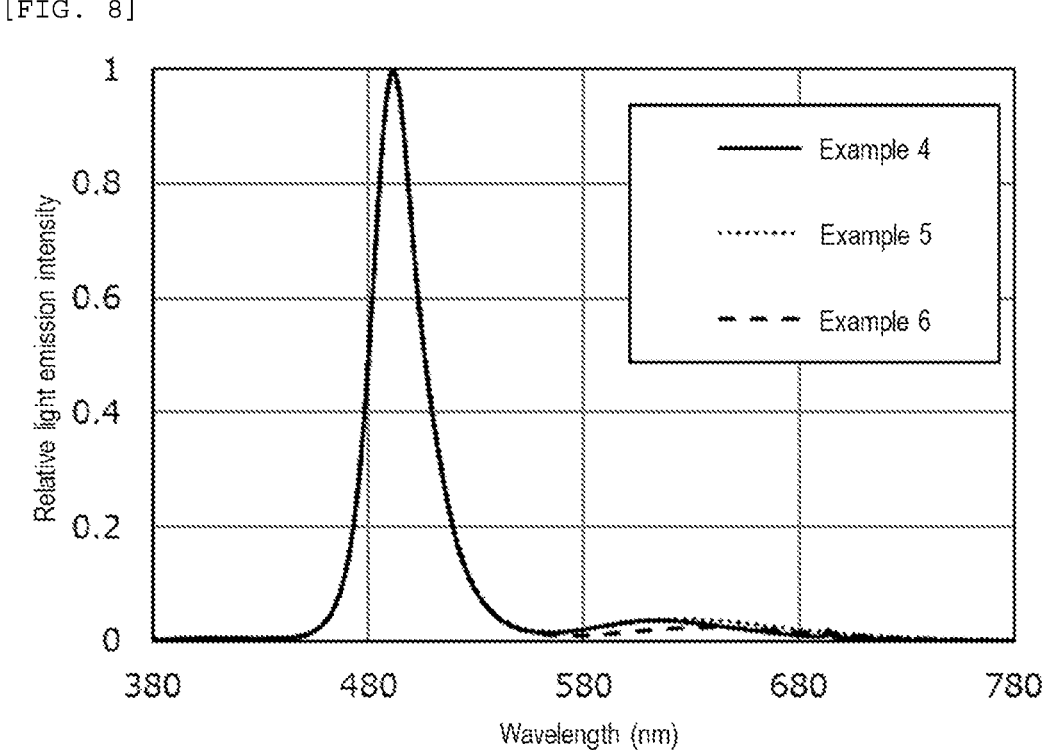

[FIG. 9]
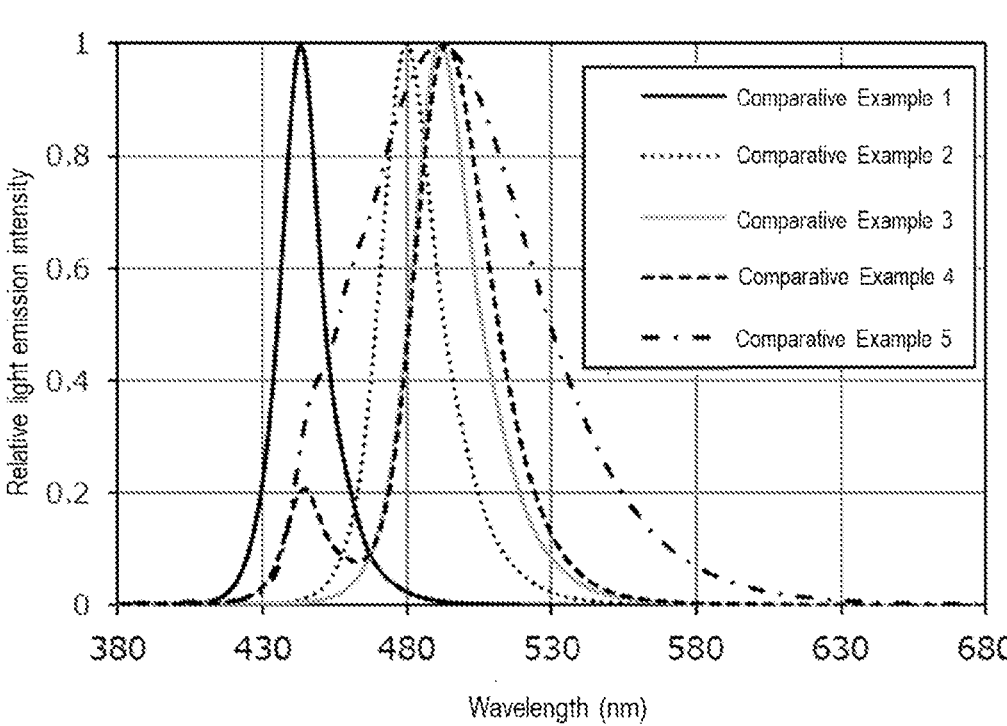

[FIG. 10]
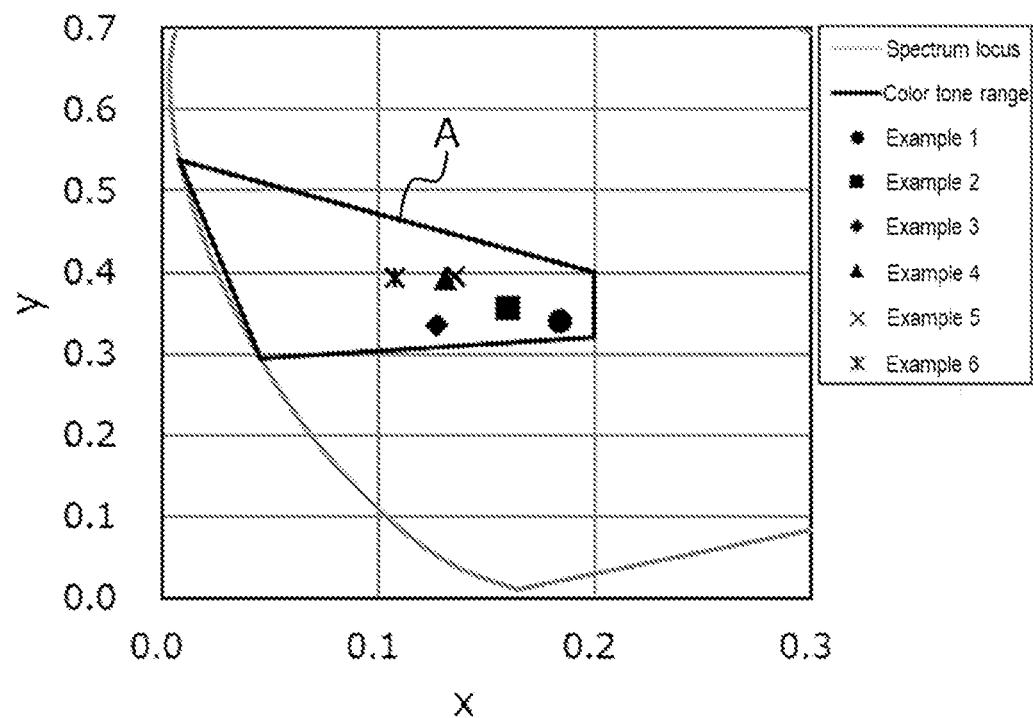

[FIG. 11]
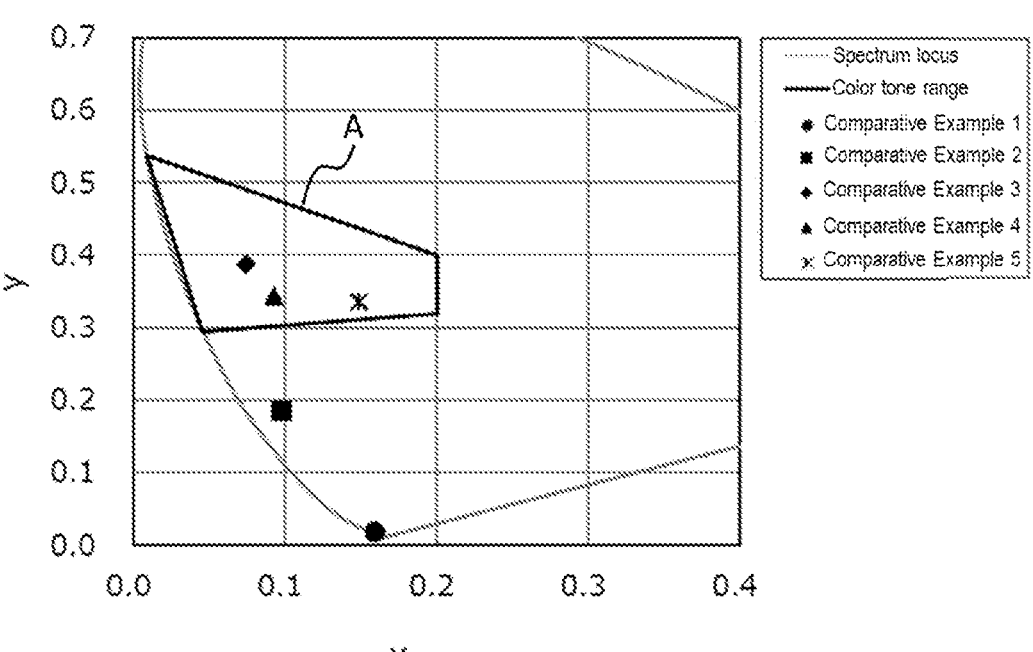

[FIG. 12]
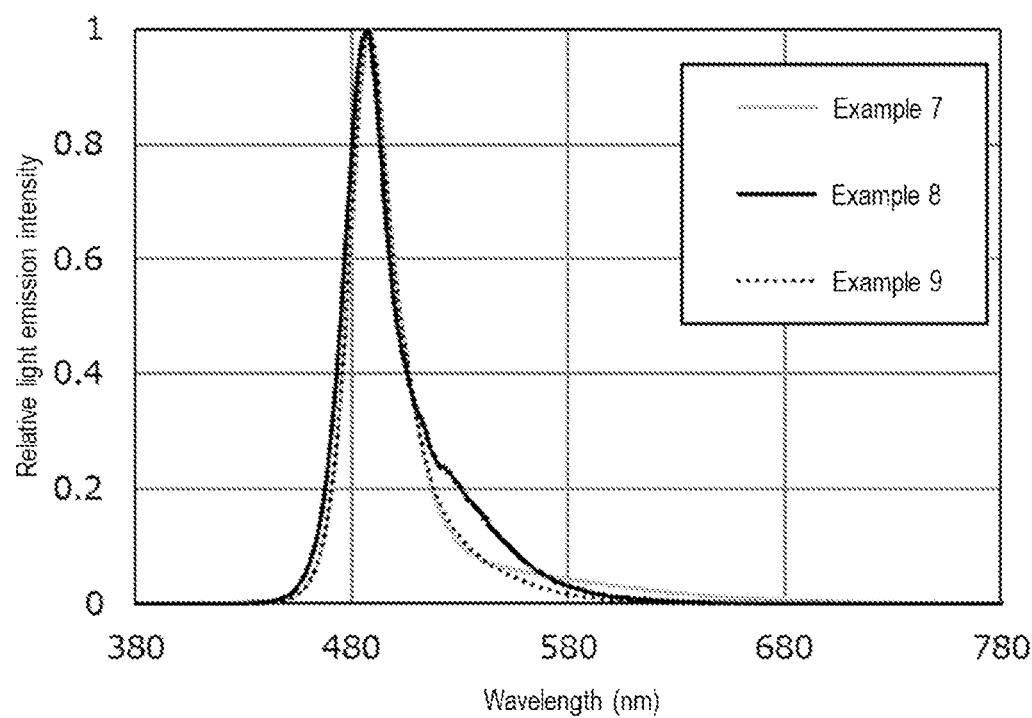

[FIG. 13]
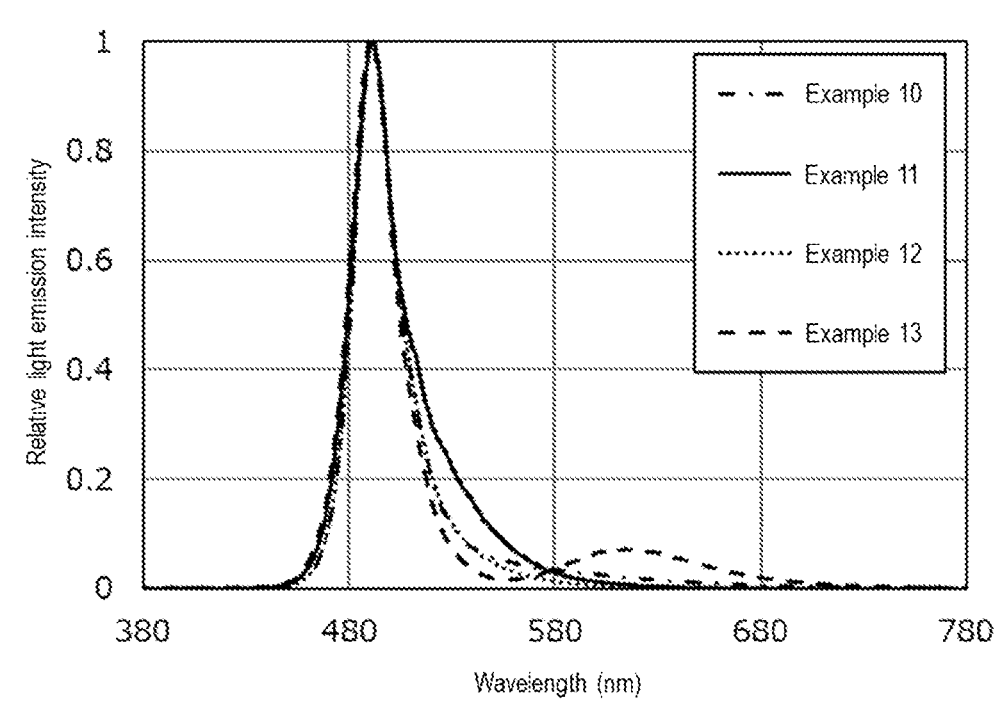

[FIG. 14]
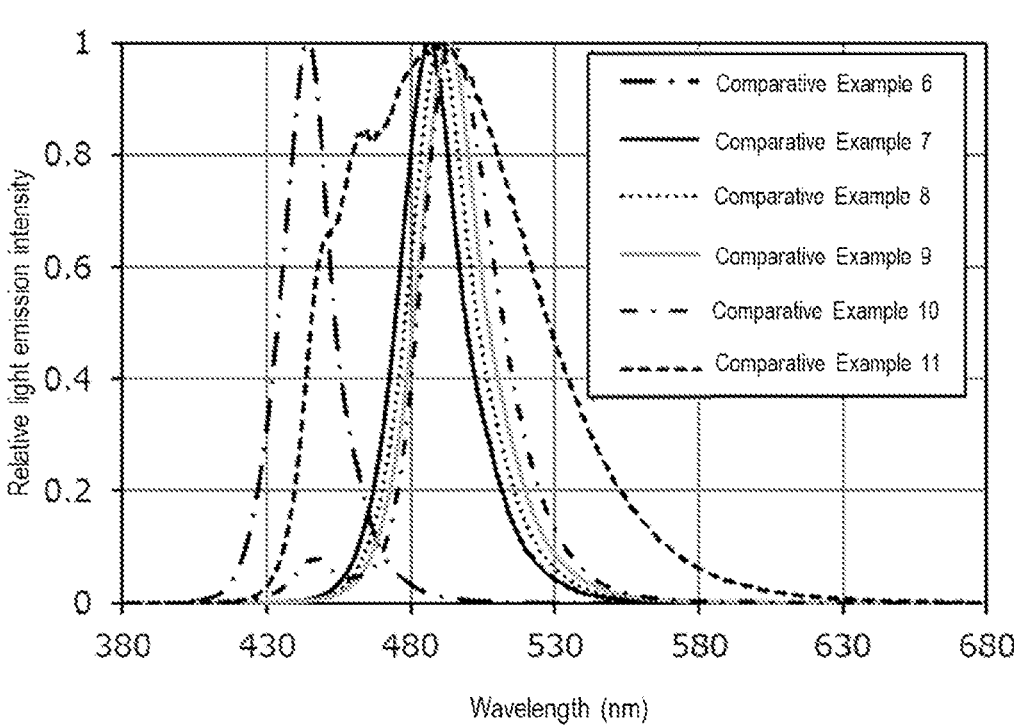

[FIG. 15]
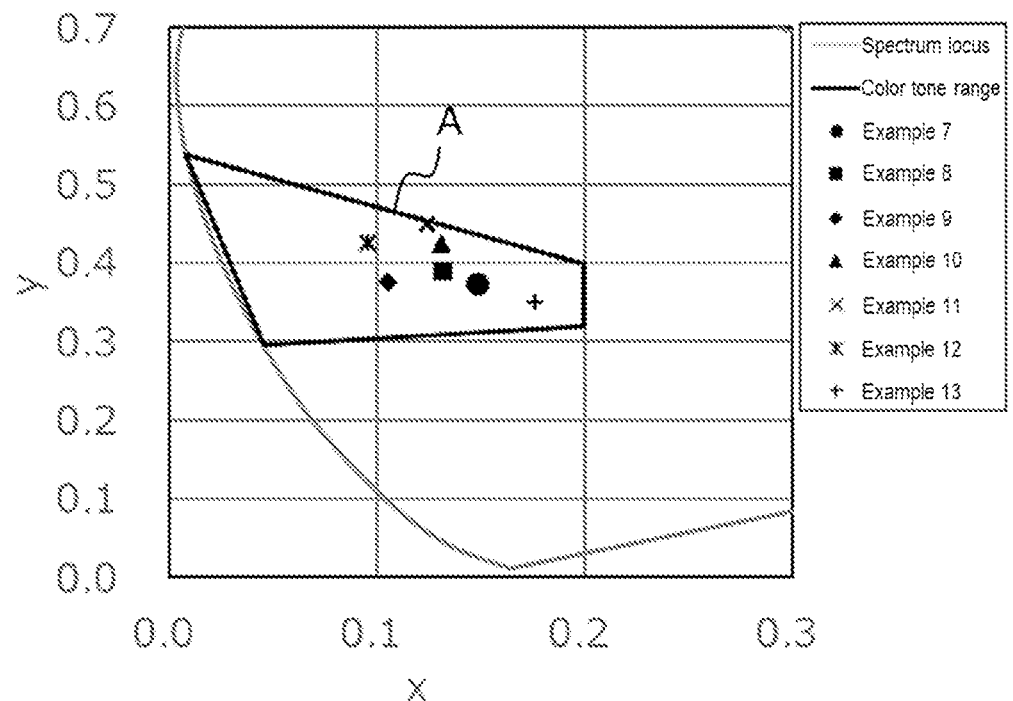

[FIG. 16]
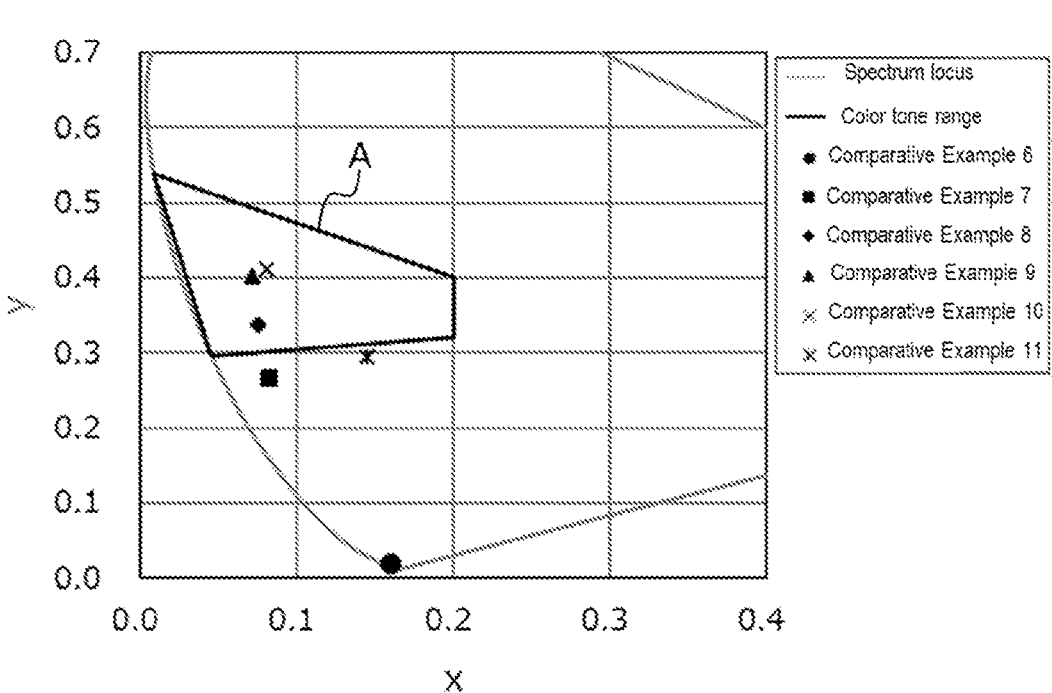

LIGHT EMITTING DEVICE

CROSS-REFERENCE TO RELATED APPLICATIONS

This is a national phase application based on International Patent Application No. PCT/JP2020/039837 filed Oct. 23, 2020, claiming priority to Japanese Patent Application No. 2019-233510 filed Dec. 24, 2019, the entire contents of which all are incorporated herein by reference.

TECHNICAL FIELD

The present invention relates to a light emitting device.

BACKGROUND ART

It is known that the visual sensitivity of the human eye varies in dark and bright places. In photopic vision that is in a bright environment, color can be perceived by the action of a cone cell, which is a photoreceptor cell (visual cell) of the human eye. In scotopic vision that is in a dark environment, many colors cannot be perceived since the cone cell does not function, but the visual sensitivity is improved by the action of a rod cell.

It is known that the peak wavelength of the visual sensitivity by the cone cell actively acting in a bright place is 555 nm, the peak wavelength of the visual sensitivity by the rod cell actively acting in a dark place is 507 nm, and the peak of the visual sensitivity is different in a dark place and a bright place. Such a phenomenon is known as the Purkinje Phenomenon in which the color on the long wavelength side is vividly seen in a bright place and the color on the short wavelength side is vividly seen in a dark place.

For example, as a lighting device utilizing the Purkinje Phenomenon, Patent Document 1 proposes a street lamp emitting white light and capable of providing high footway visibility to drivers and providing high visibility to pedestrians with less perception of color unevenness between the roadway side and the footway side in a mesopic environment with a brightness between dark and bright. Patent Document 1 also states that the higher an S/P ratio, which is the ratio of scotopic vision to photopic vision, the higher the visibility of light in a mesopic environment.

CITATION LIST

Patent Document

Patent Document 1: Japanese Patent Laid-Open No. 2017-220312

SUMMARY OF THE INVENTION

Problem to be Solved by the Invention

However, when the S/P ratio is too high, the light may be perceived as dark in photopic vision and glare in scotopic vision by the human eye. Also, when a light emitting device is configured by combining a light emitting element and a fluorescent material, the fluorescent material is required to have higher wavelength conversion efficiency.

Accordingly, an embodiment of the present invention has an object to provide a light emitting device that is bright in both scotopic vision and photopic vision, reduces glare for humans, and has higher wavelength conversion efficiency of a fluorescent material.

Means for Solving Problem

An embodiment of the present invention relates to a light emitting device including a light emitting element having a dominant wavelength in a range of 430 nm or more and 500 nm or less, and a fluorescent material that is excited by light emitted from the light emitting element and has a light emission peak wavelength in a range of 507 nm or more and 660 nm or less, wherein the light emitting device emits light having a dominant wavelength in a range of 490 nm or more and 500 nm or less, wherein the light emitting device has an S/P ratio, which is the ratio of a luminous flux in scotopic vision to a luminous flux in photopic vision, being 6.5 or less, and wherein the light emitting device has a light emission intensity in the light emission peak wavelength of the light emitting element that is greater than that in the light emission peak wavelength of the fluorescent material.

Effect of the Invention

In accordance with the embodiment of the present invention, a light emitting device that is bright in both scotopic vision and photopic vision, and has reduced glare for humans, can be provided.

BRIEF DESCRIPTION OF DRAWINGS

FIG. 1 is an exemplary graph showing a photopic standard spectral luminous efficiency V ($\lambda$) and a scotopic standard spectral luminous efficiency V' ($\lambda$).

FIG. 2 is an exemplary diagram showing an area A in a part of the xy chromaticity coordinate system of the CIE 1931 chromaticity diagram.

FIG. 3 is a schematic cross-sectional view of the light emitting device according to the first embodiment of the present invention.

FIG. 4A is a schematic plan view of the light emitting device according to the second embodiment of the present invention.

FIG. 4B is a schematic cross-sectional view of the light emitting device according to the second embodiment of the present invention.

FIG. 5 is a graph showing a light emission spectrum of each fluorescent material.

FIG. 6 is a graph showing a light emission spectrum of each fluorescent material.

FIG. 7 is a graph showing a light emission spectrum of each of the light emitting devices according to Examples 1 to 3.

FIG. 8 is a graph showing a light emission spectrum of each of the light emitting devices according to Examples 4 to 6.

FIG. 9 is a graph showing a light emission spectrum of each of the light emitting devices according to Comparative Examples 1 to 5.

FIG. 10 is a graph showing the chromaticity coordinates ($x_D$, $y_D$) of the light emission color of each of the light emitting devices according to Examples 1 to 6 and the target color tone range (area A) on the CIE 1931 chromaticity diagram.

FIG. 11 is a graph showing the chromaticity coordinates ($x_D$, $y_D$) of the light emission color of each of the light emitting devices according to Comparative Examples 1 to 5 and the target color tone range (area A) on the CIE 1931 chromaticity diagram.

FIG. 12 is a graph showing a light emission spectrum of each of the light emitting devices according to Examples 7 to 9.

FIG. 13 is a graph showing a light emission spectrum of each of the light emitting devices according to Examples 10 to 13.

FIG. 14 is a graph showing a light emission spectrum of each of the light emitting devices according to Comparative Examples 6 to 11.

FIG. 15 is a graph showing the chromaticity coordinates $(x_D, y_D)$ of the light emission color of each of the light emitting devices according to Examples 7 to 13 and the target color tone range (area A) on the CIE 1931 chromaticity diagram.

FIG. 16 is a graph showing the chromaticity coordinates $(x_D, y_D)$ of the light emission color of each of the light emitting devices according to Comparative Examples 6 to 11 and the target color tone range (area A) on the CIE 1931 chromaticity diagram.

MODE(S) FOR CARRYING OUT THE INVENTION

The light emitting device according to the present invention will be hereunder described on the basis of embodiments. The embodiments described below are exemplifications for embodying the technical idea of the present invention, and the present invention is not limited to the following light emitting device. The relationships between color names and chromaticity coordinates, and the relationships between wavelength ranges of light and color names of monochromic light are in accordance with Japanese Industrial Standard (JIS) 28110. In the case where a plurality of substances corresponding to each component are present in a composition, the content of each component in the composition means the total amount of the plurality of substances present in the composition, unless otherwise specified.

Light Emitting Device

The light emitting device includes a light emitting element having a dominant wavelength in a range of 430 nm or more and 500 nm or less, and a fluorescent material that is excited by light emitted from the light emitting element and has a light emission peak wavelength in a range of 507 nm or more and 660 nm or less, wherein the light emitting device emits light having a dominant wavelength in a range of 490 nm or more and 500 nm or less, wherein the light emitting device has an S/P ratio, which is the ratio of a luminous flux in scotopic vision to a luminous flux in photopic vision, being 6.5 or less, and wherein the light emitting device has a light emission intensity in the light emission peak wavelength of the light emitting element that is greater than that in the light emission peak wavelength of the fluorescent material.

The dominant wavelength of the light emitting element refers to a wavelength of the point where the chromaticity coordinates (x=0.3333, y=0.3333) of white light and the chromaticity coordinates $(x_E, y_E)$ of the light emission color of the light emitting element in the Commission Internationale de l'Eclairage (CIE) 1931 chromaticity diagram are connected by a straight line, and the extension line and the spectrum locus intersect. The dominant wavelength of the light emitting device refers to a wavelength of the point where the chromaticity coordinates (x=0.3333, y=0.3333) of white light and the chromaticity coordinates $(x_D, y_D)$ of the light emission color of the light emitting device in the CIE 1931 chromaticity diagram are connected by a straight line, and the extension line and the spectrum locus intersect.

The light emitting device includes a light emitting element having a dominant wavelength in a wavelength range from blue to bluish-green and a fluorescent material having a light emission peak wavelength in a wavelength range of green, yellowish-green, yellow, yellowish-red, and red; and emits light having a dominant wavelength in a wavelength range from bluish-green to green. It is known that the higher the S/P ratio, which is the ratio of a luminous flux in scotopic vision to a luminous flux in photopic vision, the higher the human visibility. FIG. 1 is a graph showing a photopic standard spectral luminous efficiency V ($\lambda$) and a scotopic standard spectral luminous efficiency V' ($\lambda$). As shown in FIG. 1, the peak wavelength in the photopic standard spectral luminous efficiency V ($\lambda$) is 555 nm, the peak wavelength in the scotopic standard spectral luminous efficiency V' ($\lambda$) is 507 nm, and the peak of the visual sensitivity is different in a dark place and a bright place. It is known to the human eye that, since the peak wavelength of the visual sensitivity of the human eye is different in a dark place and a bright place, the color on the long wavelength side is vividly seen in a bright place and the color on the short wavelength side is vividly seen in a dark place due to the Purkinje Phenomenon. In the case where the S/P ratio of the light emitting device that emits light having a dominant wavelength in the wavelength range from bluish-green to green is increased for improving the visibility, the light may be perceived as too glaring when viewed in a dark place since the color on the short wavelength side becomes too vivid. The light emitting device according to the embodiment of the present invention has an S/P ratio of 6.5 or less, even when emitting light having a dominant wavelength in the wavelength range from blue to green including bluish-green, so that the difference between the luminous flux in a dark place and the luminous flux in a bright place can be reduced, the light can be brightly seen in both scotopic vision and photopic vision, excellent visibility can be maintained, and the glare perceived by humans can be reduced.

The S/P ratio, which is the ratio of a luminous flux in scotopic vision to a luminous flux in photopic vision of light emitted from the light emitting device, is 6.5 or less, preferably 6.0 or less; and preferably 2.0 or more, more preferably 3.0 or more, and even more preferably 4.0 or more. By setting the S/P ratio of light emitted from the light emitting device to 6.5 or less and reducing the difference between the luminous flux in scotopic vision and the luminous flux in photopic vision, the light emitting device emitting light having a dominant wavelength in the wavelength range from blue to green including bluish-green is also able to emit light that is bright in both scotopic vision and photopic vision while maintaining excellent visibility, in which the glare perceived by humans can be reduced in both scotopic vision and photopic vision. The dominant wavelength, the luminous flux, the chromaticity coordinates in the xy chromaticity coordinate system of the CIE 1931 chromaticity diagram described later, and the radiant flux of the light emitted from the light emitting device or the light emitting element can be measured using an optical measurement system that combines a spectrophotometer (for example, PMA-11, manufactured by Hamamatsu Photonics K.K.) and an integral sphere. Further, the S/P ratio, which is the ratio of a luminous flux in a dark place to a luminous flux in a bright place, can be calculated based on the calculation formula (i).

$$R_{SP} = \frac{K' \int V'(\lambda)\Phi_e(\lambda)d\lambda}{K \int V(\lambda)\Phi_e(\lambda)d\lambda} \qquad \text{(i)}$$

In the calculation formula (i), the constant K is 6,831 lm/W, the constant K' is 1,700 lm/W, and $\Phi e$ ($\lambda$) represents a radiant flux (spectral total radiant flux) of the light emitting device in each of Examples and Comparative Examples.

The light emitting device preferably emits light having chromaticity coordinates (x, y) within an area in the xy chromaticity coordinate system of the CIE 1931 chromaticity diagram, wherein when the chromaticity coordinates (x=0.0082, y=0.5384) is defined as a first point, the chromaticity coordinates (x=0.0454, y=0.2950) is defined as a second point, the chromaticity coordinates (x=0.2000, y=0.3200) is defined as a third point, and the chromaticity coordinates (x=0.2000, y=0.4000) is defined as a fourth point, the area is demarcated by a first straight line connecting the first point and the second point, a second straight line connecting the second point and the third point, a third straight line connecting the third point and the fourth point, and a fourth straight line connecting the fourth point and the first point. FIG. 2 shows a part of the xy chromaticity coordinate system of the CIE 1931 chromaticity diagram. The light emitting device preferably emits light in an area A surrounded by straight lines connecting the first and second points, the second and third points, the third and fourth points, and the fourth and first points shown in FIG. 2. The light emitting device emits light in the area A shown in FIG. 2; and the light in the area A has a dominant wavelength in a range of 490 nm or more and 500 nm or less, and exhibits a light emission color from blue to green including bluish-green.

In a light emission spectrum of the light emitting device, the integrated value ratio Ib/Ia of an integrated value Ib in a wavelength range of 380 nm or more and 531 nm or less to an integrated value Ia in a wavelength range of 380 nm or more and 780 nm or less is preferably in a range of 0.6 or more and 0.95 or less, more preferably in a range of 0.65 or more and 0.94 or less, even more preferably in a range of 0.70 or more and 0.93 or less, and particularly preferably in a range of 0.75 or more and 0.92 or less. When the integrated value ratio Ib/Ia in the light emission spectrum of the light emitting device falls within the range of 0.6 or more and 0.95 or less, the light emitting device emits light having a dominant wavelength in the wavelength range from blue to green including bluish-green, and is able to emit light that is bright in both scotopic vision and photopic vision while maintaining excellent visibility, in which the glare perceived by humans can be reduced in both scotopic vision and photopic vision. The light emission spectrum of the light emitting device, the integrated value Ia in the wavelength range of 380 nm or more and 780 nm or less and the integrated value Ib in the wavelength range of 380 nm or more and 531 nm or less in the measured light emission spectrum, and a light emission intensity b of the light emission peak wavelength of the fluorescent material in the light emission spectrum of the light emitting device and a light emission intensity a of the light emission peak wavelength of the light emitting element in the light emission spectrum of the light emitting device described later can be measured using an optical measurement system that combines a spectrophotometer (for example, PMA-11, manufactured by Hamamatsu Photonics K.K.) and an integral sphere. The integrated value ratio Ib/Ia can be determined from the measured integrated value Ia and the integrated value Ib. The light emission intensity ratio a/b described later can be determined from the light emission intensity a of the light emission peak wavelength of the light emitting element and the light emission intensity b of the light emission peak wavelength of the fluorescent material in the measured light emission spectrum of the light emitting device.

In the light emission spectrum of the light emitting device, the light emitting device has a light emission intensity a of the light emission peak wavelength of the light emitting element that is greater than the light emission intensity b of the light emission peak wavelength of the fluorescent material. Since the light emission intensity a of the light emission peak wavelength of the light emitting element is higher than the light emission intensity b of the light emission peak wavelength of the fluorescent material, even when emitting light having a dominant wavelength in the wavelength range from blue to green including bluish-green, the S/P ratio can be set to 6.5 or less, so that the difference between the luminous flux in a dark place and the luminous flux in a bright place can be reduced, the light can be brightly seen in both scotopic vision and photopic vision, excellent visibility can be maintained, and the glare perceived by humans can be reduced.

In the light emission spectrum of the light emitting device, the light emission intensity ratio a/b of the light emission intensity a of the light emission peak wavelength of the light emitting element to the light emission intensity b of the light emission peak wavelength of the fluorescent material is preferably 3.0 or more. When the light emission intensity ratio a/b of the light emission intensity a of the light emission peak wavelength of the light emitting element to the light emission intensity b of the light emission peak wavelength of the fluorescent material is 3.0 or more in the light emission spectrum of the light emitting device, the light emitting device emits light having a dominant wavelength in the range of 490 nm or more and 500 nm or less, and the light emitting device, which has an S/P ratio of 6.5 or less, is able to emit light that is bright in both scotopic vision and photopic vision while maintaining excellent visibility, in which the glare perceived by humans can be reduced in both scotopic vision and photopic vision. When the light emission intensity ratio a/b is less than 3.0 in the light emission spectrum of the light emitting device, the light emitted from the light emitting device may have a lower light emission intensity of the light emission peak wavelength of the light emitting element than the light emission intensity of the light emission peak wavelength of the fluorescent material, and may not be able to maintain the visibility that is bright in both scotopic vision and photopic vision. In the light emission spectrum of the light emitting device, the light emission intensity ratio a/b is more preferably 3.5 or more, and even more preferably 4.0 or more. In the light emission spectrum of the light emitting device, the light emission intensity ratio a/b of the light emission intensity a of the light emission peak wavelength of the light emitting element to the light emission intensity b of the light emission peak wavelength of the fluorescent material may be 50 or less, and may be 45 or less.

The light emitting device preferably emits light having a radiant flux ratio Fb/Fa of a radiant flux Fb of the light emitting device to a radiant flux Fa of the light emitting element being 0.75 or more. When the radiant flux ratio Fb/Fa of the radiant flux Fb of the light emitted from the light emitting device to the radiant flux Fa of the light emitting element used in the light emitting device is 0.75 or more, the light emitting device emits light that exhibits blue to green light emitting colors including bluish-green and is bright in both scotopic vision and photopic vision while reducing the glare perceived by humans, and maintaining excellent visibility in a state where the radiant energy of the light emitted by the light emitting element is maintained. It is more preferable for the light emitting device to emit light having a radiant flux ratio Fb/Fa of 0.76 or more, it is even more preferable to emit light having a radiant flux ratio Fb/Fa of 0.78 or more, and it is particularly preferable to emit light having a radiant flux ratio Fb/Fa of 0.80 or more. The radiant flux ratio Fb/Fa of the radiant flux Fb of the light emitting device to the radiant flux Fa of the light emitting element is generally 1 or less, may be 0.99 or less, and may be 0.98 or less.

Light Emitting Element

As the light emitting element, for example, a light emitting diode (LED) chip or a laser diode (LD) chip, which is a semiconductor light emitting element using a nitride-based semiconductor represented by a compositional formula of $In_xAl_yGa_{1-x-y}N$ (0<X, 0≤Y, X+Y<1), can be used, and an LED chip is preferably used.

The light emitting element has a dominant wavelength in a range of 430 nm or more and 500 nm or less. The dominant wavelength of light emitted from the light emitting element is preferably in a range of 440 nm or more and 500 nm or less, and more preferably in a range of 450 nm or more and 500 nm or less.

The light emitting element preferably has a light emission peak wavelength in a range of 380 nm or more and 500 nm or less, more preferably in a range of 390 nm or more and 495 nm or less, even more preferably in a range of 400 nm or more and 490 nm or less, and particularly preferably in a range of 420 nm or more and 490 nm or less.

The light emitting element is provided with a p-electrode and an n-electrode. The p-electrode and the n-electrode of the light emitting element may be formed on the same side surface as the light emitting element, or may be provided on different side surfaces. The light emitting element may be flip-chip mounted.

Fluorescent Material

The fluorescent material is excited by light emitted from the light emitting element and has a light emission peak wavelength in a range of 507 nm or more and 660 nm or less. The light emission peak wavelength of the fluorescent material is preferably in a range of 510 nm or more and 655 nm or less, and more preferably in a range of 520 nm or more and 650 nm or less.

The fluorescent material preferably has a half value width in a range of 45 nm or more and 120 nm or less. The half value width (full width at half maximum) of the fluorescent material means a wavelength width of a light emission spectrum showing a light emission intensity of 50% of the maximum light emission intensity in the light emission spectrum of the fluorescent material. The half value width of the fluorescent material is more preferably in a range of 48 nm or more and 110 nm or less, and even more preferably in a range of 50 nm or more and 105 nm or less.

The fluorescent material preferably contains at least one fluorescent material selected from the group consisting of (I) a rare earth aluminate fluorescent material having a composition containing at least one element Ln selected from the group consisting of Y, La, Lu, Gd, and Tb; Ce; Al; and optionally at least one element selected from the group consisting of Ga and Sc, (II) a β-SiAlON fluorescent material having a composition containing Si, Al, O, N, and Eu, (III) a halosilicate fluorescent material having a composition containing Ca, Eu, Mg, Si, O, and at least one halogen element selected from the group consisting of F, Cl, and Br, and (IV) a nitride fluorescent material having a composition containing Ca, Eu, Si, Al, N, and optionally Sr. By including at least one fluorescent material selected from the group consisting of a rare earth aluminate fluorescent material, a β-SiAlON fluorescent material, a halosilicate fluorescent material, and a nitride fluorescent material, together with a light emitting element having a dominant wavelength in a range of 430 nm or more and 500 nm or less, the light emitting device emits light having a dominant wavelength in a range of 490 nm or more and 500 nm or less.

The fluorescent material preferably contains at least one fluorescent material selected from the group consisting of a rare earth aluminate fluorescent material having a composition represented by the following formula (1), a halosilicate fluorescent material having a composition represented by the following formula (2), a β-SiAlON fluorescent material having a composition represented by the following formula (3), and a nitride fluorescent material having a composition represented by the following formula (4). The fluorescent material may contain two or more fluorescent materials having compositions represented by the following formulae (1) to (4).

$$(Y,Lu,Gd)_3(Al,Ga)_5O_{12}{:}Ce \quad\quad (1)$$

$$(Ca,Sr,Ba)_8MgSi_4O_{16}(F,Cl,Br)_2{:}Eu \quad\quad (2)$$

$$Si_{6-z}Al_zO_zN_{8-z}{:}Eu,\ \text{wherein}\ 0{\leq}z{\leq}4.2 \quad\quad (3)$$

$$(Sr,Ca)AlSiN_3{:}Eu \quad\quad (4)$$

In the present specification, plural elements sectioned by comma (,) in the formula representing the composition of a fluorescent material mean that at least one of these plural elements is contained in the composition, and a combination of two or more of these plural elements may be contained. In the formula representing the composition of a fluorescent material, the part before the colon (:) represents the elements and the molar ratio constituting a host crystal, and the part after the colon (:) represents an activating element. The "molar ratio" represents the molar amount of an element in 1 mol of the composition of the fluorescent material.

The rare earth aluminate fluorescent material may have a composition represented by the following formula (1a).

$$(Y_{1-a-b-c}Lu_aGd_b)_3(Al_{1-c}Ga_c)_5O_{12}{:}Ce_d \quad\quad (1a)$$

wherein a, b, c, and d each satisfy 0≤a≤1.0, 0≤b≤1.0, 0≤a+b≤1.0, 0≤c≤1.0, and 0<d≤0.022; and d may satisfy 0.001≤d≤0.021.

The halosilicate fluorescent material may have a composition represented by the following formula (2a).

$$(Ca_{1-e-f}Sr_eBa_f)_8MgSi_4O_{16}(F_{1-g-h}Cl_gBr_h)_2{:}Eu_i \quad\quad (2a)$$

wherein e, f, g, h, and i each satisfy 0≤e≤1.0, 0≤f≤1.0, 0≤e+f≤1.0, 0≤g≤1.0, 0≤h≤1.0, 0≤g+h≤1.0, and 0<i≤1.0; i may satisfy 0.01≤i≤0.9; and g may satisfy 0<g≤1.0.

The β-SiAlON fluorescent material may have a composition represented by the following formula (3a).

$$Si_{6-z}Al_zO_zN_{8-z}{:}Eu_j \quad\quad (3a)$$

wherein j and z each satisfy 0<j≤1.0 and 0<z≤4.2; and j may satisfy 0.01≤j≤0.9.

The nitride fluorescent material may have a composition represented by the following formula (4a).

$$(Sr_{1-k}Ca_k)AlSiN_3{:}Eu_m \quad\quad (4a)$$

wherein k and m each satisfy $0 \leq k \leq 1.0$ and $0 < m \leq 1.0$; and m may satisfy $0.0001 \leq m \leq 0.9$.

The average particle diameter of the fluorescent material is preferably in a range of 2 μm or more and 40 μm or less, more preferably in a range of 3 μm or more and 30 μm or less, and even more preferably in a range of 5 μm or more and 25 μm or less. When the particle diameter of the fluorescent material particles is larger, the wavelength of the light emitted from the light emitting element can be more efficiently converted, and the light extraction efficiency can be improved. On the other hand, when the fluorescent material particles are too large, the workability in the manufacturing process of the light emitting device is lowered. The average particle diameter of the fluorescent material particles can be measured according to a Fisher Sub-Sieve Sizer method (hereinafter, also referred to as "FSSS method"). The FSSS method is a type of an air permeability method, and is a method for measuring a specific surface area by utilizing the flow resistance of air so as to mainly determine a particle diameter of primary particles. The average particle diameter measured according to the FSSS method is a Fisher Sub-Sieve Sizer's number.

Wavelength Conversion Member

The light emitting device preferably includes a wavelength conversion member including a fluorescent material and a translucent material. The wavelength conversion member preferably includes a fluorescent material in a range of 0.5 part by mass or more and 65 parts by mass or less relative to 100 parts by mass of the translucent material. The light emitting device includes a wavelength conversion member including a fluorescent material that is excited by light emitted from the light emitting element, and the wavelength conversion member is arranged on the light emitting side of the light emitted from the light emitting element, so that the wavelength of the light emitted from the light emitting element can be efficiently converted by the fluorescent material included in the wavelength conversion member. The wavelength conversion member may include 1 part by mass or more of the fluorescent material, and may include 60 parts by mass or less of the fluorescent material, relative to 100 parts by mass of the translucent material.

Translucent Material

Examples of the translucent material include at least one selected from the group consisting of a resin, glass, and an inorganic substance. The resin is preferably at least one selected from the group consisting of an epoxy resin, a silicone resin, a phenol resin, and a polyimide resin. Examples of the inorganic substance include at least one selected from the group consisting of aluminum oxide and aluminum nitride. The wavelength conversion member may optionally contain a filler, a colorant, and a light diffusing material in addition to the fluorescent material and the translucent material. Examples of the filler include silicon oxide, barium titanate, titanium oxide, and aluminum oxide. As for the content of the other components than the fluorescent material and the translucent material contained in the wavelength conversion member, the total content of the other components is in a range of 0.01 part by mass or more and 50 parts by mass or less, may be in a range of 0.1 part by mass or more and 45 parts by mass or less, and may be in a range of 0.5 part by mass or more and 40 parts by mass or less, relative to 100 parts by mass of the translucent material.

Light Emitting Device According to First Embodiment

An example of the light emitting device will be described with reference to the drawings. FIG. 3 shows a schematic cross-sectional view of a light emitting device 100 according to the first embodiment. The light emitting device 100 includes a light emitting element 11 having a dominant wavelength in a range of 430 nm or more and 500 nm or less, a wavelength conversion member 31 including at least one fluorescent material 21 that is excited by light emitted from the light emitting element 11 and emits light, and a molded body 41. The molded body 41 is formed by integrally molding a first lead 51, a second lead 52, and a resin portion 42 containing a resin. The molded body 41 forms a recessed portion having a bottom surface and side surfaces, in which the light emitting element 11 is mounted on the bottom surface of the recessed portion. The light emitting element 11 has a pair of positive and negative electrodes, and the positive and negative electrodes each are electrically connected to the first lead 51 and the second lead 52 via a wire that is a conductive member 61. The light emitting element 11 is covered by the wavelength conversion member 31. The wavelength conversion member 31 includes a fluorescent material 21 and a translucent material. The fluorescent material 21 is excited by light emitted from the light emitting element 11 and has at least one light emission peak wavelength in a specific wavelength range. The wavelength conversion member 31 may include two or more fluorescent materials 21 having different light emission peak wavelengths. The first lead 51 and the second lead 52 connected to the pair of positive and negative electrodes of the light emitting element 11 are partly exposed to the outside of the molded body 41. The light emitting device 100 is able to emit light upon receiving electric power supply from the outside of the light emitting device 100 via the first lead 51 and the second lead 52.

The wavelength conversion member 31 in the light emitting device 100 according to the first embodiment includes a fluorescent material 21 and a translucent material, and the translucent material is preferably a resin. Examples of the resin, which is the translucent material used for the wavelength conversion member 31 in the light emitting device 100 according to the first embodiment, include the resins used for the above-mentioned translucent material.

Method for Producing Light Emitting Device According to First Embodiment

An example of the method for producing a light emitting device according to the first embodiment will be described. For the details, for example, the disclosure of Japanese Unexamined Patent Publication No. 2010-062272 may be referred to. The method for producing a light emitting device preferably includes a step of preparing a molded body, a step of arranging a light emitting element, a step of arranging a wavelength conversion member-forming composition, and a step of forming a resin package. When using an aggregated molded body having a plurality of recessed portions as the molded body, the production method may include an individualizing step of separating each resin package in each unit region after the step of forming a resin package.

In the step of preparing a molded body, a plurality of leads are integrally molded using a thermosetting resin or a thermoplastic resin to prepare a molded body having a recessed portion with side surfaces and a bottom surface. The molded body may be formed from an aggregated substrate including a plurality of recessed portions.

In the step of arranging a light emitting element, a light emitting element is arranged on the bottom surface of the recessed portion of the molded body, and positive and negative electrodes of the light emitting element are connected to a first lead and a second lead, respectively, by wires.

In the step of arranging a wavelength conversion member-forming composition, a wavelength conversion member-forming composition is arranged in the recessed portion of the molded body.

In the step of forming a resin package, the wavelength conversion member-forming composition arranged in the recessed portion of the molded body is cured to form a resin package, thereby producing a light emitting device. When using a molded body formed from an aggregated substrate having a plurality of recessed portions, in the individualizing step after the step of forming a resin package, the resin package is separated for each resin package in each unit region of the aggregated substrate having a plurality of recessed portions, thereby producing individual light emitting devices. Thus, the light emitting device according to the first embodiment shown in FIG. 3 can be produced.

Light Emitting Device According to Second Embodiment

FIG. 4A shows a schematic plan view of a light emitting device 200 according to the second embodiment; and FIG. 4B shows a schematic cross-sectional view of the IIA-IIA' line of the light emitting device 200 shown in FIG. 4A. The light emitting device 200 includes a light emitting element 12 having a dominant wavelength in a range of 430 nm or more and 500 nm or less, and a wavelength conversion body 34 including a wavelength conversion member 32 containing at least one fluorescent material that is excited by light emitted from the light emitting element 12 and emits light and a translucent body 33 integrally molded with the wavelength conversion member 32. The light emitting element 12 is flip-chip mounted on a substrate 72 via bumps, which are conductive members 62. The wavelength conversion member 32 of the wavelength conversion body 34 is arranged on the light emitting surface of the light emitting element 12 via an adhesive layer 82. The side surfaces of the light emitting element 12 and the wavelength conversion body 34 are covered with a covering member 92 that reflects light. The wavelength conversion member 32 contains a fluorescent material that is excited by light emitted from the light emitting element 12 and has at least one light emission peak wavelength in a specific wavelength range. The wavelength conversion member 32 may contain two or more fluorescent materials having different light emission peak wavelength ranges. The light emitting element 12 receives electric power from the outside of the light emitting device 200 via wiring and the conductive members 62 formed on the substrate 72, so that the light emitting device 200 is able to emit light. The light emitting device 200 may include a semiconductor element 13 such as a protective element for preventing the light emitting element 12 from being destroyed by applying an excessive voltage. The covering member 92 is provided so as to cover, for example, the semiconductor element 13. Each member used in the light emitting device according to the second embodiment will be hereunder described. For the details, for example, the disclosure of Japanese Unexamined Patent Publication No. 2014-112635 may be referred to.

Substrate of Light Emitting Device According to Second Embodiment

The substrate is preferably made of an insulating material that is hard to transmit light from the light emitting element and external light. Examples of the material of the substrate include ceramics such as aluminum oxide and aluminum nitride, and resins such as a phenol resin, an epoxy resin, a polyimide resin, a bismaleimide triazine resin (BT resin), and a polyphthalamide (PPA) resin. Ceramics have high heat resistance and are thus preferable as a substrate material.

Wavelength Conversion Body of Light Emitting Device According to Second Embodiment Wavelength Conversion Member The wavelength conversion body preferably includes a wavelength conversion member including a fluorescent material and a translucent material, and more preferably includes a translucent body on which the wavelength conversion member is arranged.

The wavelength conversion member includes a fluorescent material and at least one of the above-mentioned translucent materials selected from the group consisting of a resin, glass, and an inorganic substance (for example, aluminum oxide); and is preferably formed into a sheet shape or a plate shape. The wavelength conversion member may have one layer or two or more layers. The wavelength conversion member may optionally include a filler, a colorant, and a light diffusing material in addition to the fluorescent material and the translucent material.

The wavelength conversion member may use a ceramic composite obtained by sintering a fluorescent material and the above-mentioned glass or inorganic substance that is a translucent material, and may be formed into a sheet shape or a plate shape.

Translucent Body

The translucent body can use a plate-shaped body made of a translucent material such as glass or resin. Examples of the glass include borosilicate glass and quartz glass. Examples of the resin include a silicone resin and an epoxy resin. The thickness of the translucent body may be such that the mechanical strength is not lowered in the producing process and a fluorescent material layer can sufficiently supported. The translucent body may contain a diffusing agent. When the translucent body contains a diffusing agent, unevenness in color and luminance of the light emitted from the light emitting device can be suppressed. As the diffusing agent, at least one selected from the group consisting of titanium oxide, barium titanate, aluminum oxide, and silicon oxide can be used.

Adhesive Layer

The adhesive layer is interposed between the light emitting element and the wavelength conversion member to adhere the light emitting element and the wavelength conversion member together. The adhesive constituting the adhesive layer is preferably made of a material capable of optically connecting the light emitting element and the wavelength conversion member. The material constituting the adhesive layer is preferably at least one resin selected from the group consisting of an epoxy resin, a silicone resin, a phenol resin, and a polyimide resin.

Semiconductor Element

Examples of the semiconductor element optionally provided in the light emitting device include a transistor for controlling the light emitting element and a protective element for suppressing the destruction and the performance deterioration of the light emitting element due to excessive voltage application. Examples of the protective element include a Zener diode.

Covering Member

As the material of the covering member, an insulating material is preferably used. More specific examples thereof include a phenol resin, an epoxy resin, a bismaleimide triazine resin (BT resin), a polyphthalamide (PPA) resin, and a silicone resin. A colorant and a filler may be added to the covering member as necessary. The filler is preferably an oxide containing at least one element selected from the group consisting of yttrium, zirconium, aluminum, titanium, magnesium, and silicon. The amount of the filler contained in the covering member is preferably in a range of 10 parts by mass or more and 100 parts by mass or less relative to 100 parts by mass of the resin, in consideration of reflectivity and workability.

Conductive Member

As the conductive member, a bump can be used. Examples of the material of the bump include Au and an alloy thereof, and examples of the other conductive member include eutectic solder (Au—Sn), Pb—Sn, and lead-free solder. The light emitting device may include an underfill in order to protect the light emitting element, the semiconductor element, and the conductive member arranged on the substrate from dust, moisture, and external forces. Examples of the material of the underfill include a silicone resin, an epoxy resin, and a urea resin. The underfill can contain a colorant, a light diffusing agent, and a filler in these resins as necessary.

Method for Producing Light Emitting Device According to Second Embodiment

An example of the method for producing a light emitting device according to the second embodiment will be described. For the details, for example, the disclosure of Japanese Unexamined Patent Publication No. 2014-112635 or Japanese Unexamined Patent Publication No. 2017-117912 may be referred to. The method for producing a light emitting device preferably includes a step of arranging a light emitting element, optionally a step of arranging a semiconductor element, a step of forming a wavelength conversion body including a wavelength conversion member, a step of adhering a light emitting element and a wavelength conversion member, and a step of forming a covering member. When forming an aggregated substrate having a plurality of light emitting elements, wavelength conversion members, and semiconductor elements arranged on a single substrate, the production method may include an individualizing step of separating each resin package in each unit region.

Step of Arranging Light Emitting Element

In the step of arranging a light emitting element, a light emitting element is arranged and mounted on a substrate. When using an aggregated substrate, a plurality of light emitting elements are arranged on the aggregated substrate. Then, a semiconductor element may be arranged between the light emitting element and its adjacent light emitting element in either the row or column direction of the arranged light emitting elements, as necessary. For example, the light emitting element and the semiconductor element are flip-chip mounted on the substrate.

Step of Forming Wavelength Conversion Body Including Wavelength Conversion Member In the step of forming a wavelength conversion body including a wavelength conversion member, a wavelength conversion member may be obtained by forming a plate-shaped, sheet-shaped, or layered wavelength conversion member on one surface of a translucent body by a printing method, an adhesive method, a compression molding method, or an electrodeposition method. For example, in the printing method, a wavelength conversion member-forming composition containing a fluorescent material and a resin serving as a binder or a solvent can be printed on one surface of the translucent body to form a wavelength conversion body including a wavelength conversion member.

Step of Adhering Light Emitting Element and Wavelength Conversion Member

In the step of adhering a light emitting element and a wavelength conversion member, the wavelength conversion member is opposed to the light emitting surface of the light emitting element, and the wavelength conversion body including the wavelength conversion member and the translucent body is adhered onto the light emitting element by an adhesive layer. In a preferred embodiment, the adhering surface of the wavelength conversion body with the light emitting element, that is, the adhering surface of the wavelength conversion member with the light emitting element is preferably larger than that of the light emitting element.

Step of Forming Covering Member

In the step of forming a covering member, the side surfaces of the light emitting element and the wavelength conversion body including the wavelength conversion member and the translucent body excluding the light emitting surface are covered with a covering member-forming composition, to form a covering member on the side surfaces of the light emitting element and the wavelength conversion body excluding the light emitting surface. When a plurality of light emitting elements and semiconductor elements are arranged on an aggregated substrate and the wavelength conversion body is adhered on each light emitting element, a covering member-forming composition is filled between each light emitting element adhered with the wavelength conversion body and each semiconductor element. The covering member is for reflecting light emitted from the light emitting element, and is formed so as to cover the side surfaces without covering the light emitting surface of the wavelength conversion body and to embed the semiconductor element.

When a plurality of light emitting elements, wavelength conversion bodies, and semiconductor elements are arranged on an aggregated substrate, the covering member and the aggregated substrate are cut and separated so as to include one light emitting element, one wavelength conversion body, and one semiconductor element for each unit region, thereby producing individual light emitting devices. The covering member and the aggregated substrate are separated for each resin package in each unit region, thereby producing individual light emitting devices. Thus, the light emitting device according to the second embodiment shown in FIGS. 4A and 4B can be produced.

EXAMPLES

The present invention is hereunder specifically described by reference to the following Examples. The present invention is not limited to these Examples.

Fluorescent Material

Fluorescent materials 1 to 8 used in the light emitting devices of Examples and Comparative Examples were listed in Table 1. The fluorescent material 1 (BSiON) was a nitride fluorescent material having a composition represented by $BaSi_2O_2N_2$:Eu. The fluorescent material 2 (SAE) was an aluminate fluorescent material having a composition represented by $Sr_4Al_{14}O_{25}$:Eu. The fluorescent material 3 (LAG) was a rare earth aluminate fluorescent material having a composition represented by the above formula (1). The fluorescent material 4 (β-SiAlON) was a β-SiAlON fluorescent material having a composition represented by the above formula (3). The fluorescent material 5 (chlorosilicate) was a type of halosilicate fluorescent material having a composition represented by the above formula (2) and having a composition containing Cl. The fluorescent material 6 (SCASN-1), the fluorescent material 7 (SCASN-2) having a different molar ratio of the composition from that of the fluorescent material 6, and the fluorescent material 8 (CASN-1) each were a nitride fluorescent material having a composition represented by the above formula (4). Methods for evaluating each fluorescent material are described below, and the evaluation results are shown in Table 1.

Evaluations of Fluorescent Material Light Emission Characteristics

The light emission characteristics of each fluorescent material were measured. As for the light emission characteristics of each fluorescent material, using a quantum efficiency measuring apparatus (QE-2000, manufactured by Otsuka Electronics Co., Ltd.), each fluorescent material was irradiated with excitation light having a wavelength of 450 nm to measure the light emission spectrum at room temperature (25° C.±5° C.). From the light emission spectrum of each fluorescent material, the chromaticity coordinates (x, y) in the chromaticity coordinate system of the CIE chromaticity diagram was determined for each fluorescent material. FIGS. 5 and 6 show a light emission spectrum of each fluorescent material. From the obtained light emission spectrum of each fluorescent material, the light emission peak wavelength (nm) and the half value width were determined.

Average Particle Diameter

The average particle diameter of each fluorescent material was measured by the FSSS method using a Fisher Sub-Sieve Sizer Model 95 (manufactured by Fisher Scientific Inc.).

Compositional Analysis

The fluorescent materials 6 to 8, each of which was a nitride fluorescent material having a composition represented by the formula (4), were analyzed for Sr, Eu, and Ca in their compositions using an ICP-AES apparatus (manufactured by PerkinElmer Inc.) and an ion chromatography system (manufactured by Dionex Japan). The molar ratio of each element of Sr, Eu, and Ca was calculated when the total of Sr, Eu, and Ca was 1 mol.

Example 1

The light emitting device according to the first embodiment was produced. A first lead, a second lead, and a molded body having a recessed portion with bottom surfaces and a side surface were prepared. A light emitting element using a nitride-based semiconductor having a dominant wavelength of 483 nm was prepared, and the light emitting element was arranged on the bottom surface of the recessed portion and connected to the first lead and the second lead by wires. A wavelength conversion member-forming composition containing 30 parts by mass of the fluorescent material 3 (LAG) having a composition represented by the formula (1) relative to 100 parts by mass of a silicone resin serving as a translucent material was prepared, and the wavelength conversion member-forming composition was filled into the recessed portion of the molded body. The wavelength conversion member-forming composition was cured by heating at 150° C. for 3 hours to form a wavelength conversion member and a resin package, thereby producing a light emitting device according to the first embodiment.

Example 2

A light emitting device according to the first embodiment was produced in the same manner as in Example 1 except that a wavelength conversion member-forming composition containing 20 parts by mass of the fluorescent material 4 (β-SiAlON) having a composition represented by the formula (3) relative to 100 parts by mass of a silicone resin serving as a translucent material was prepared, and the

TABLE 1

| Fluorescent material | Composition | Peak wavelength (nm) | Half value width (nm) | Chromatically coordinates | | Average particle diameter (μm) | Molar ratio Sr + Eu + Ca = 1 mol | | |
|---|---|---|---|---|---|---|---|---|---|
| | | | | x | y | | Sr | Eu | Ca |
| 1 | BSiON | $BaSi_2O_2N_2$:Eu | 493 | 32 | 0.073 | 0.414 | 3.6 | — | — | — |
| 2 | SAE | $Sr_4Al_{14}O_{25}$:Eu | 495 | 60 | 0.146 | 0.456 | 13.6 | — | — | — |
| 3 | LAG | $Lu_7Al_5O_{12}$:Ce | 544 | 102 | 0.378 | 0.570 | 22.0 | — | — | — |
| 4 | β SiAlON | $(Si,Al)_6(O,N)_3$:Eu | 530 | 50 | 0.298 | 0.666 | 8.5 | — | — | — |
| 5 | Chlorosilicate | $Ca_8MgSi_4O_{14}Cl_2$:Eu | 522 | 62 | 0.256 | 0.650 | 11.0 | — | — | — |
| 6 | SCASN-1 | $(Sr,Ca)AlSiN_3$:Eu | 526 | 73 | 0.650 | 0.350 | 14.0 | 0.950 | 0.020 | 0.030 |
| 7 | SCASN-2 | $(Sr,Ca)AlSiN_3$:Eu | 633 | 95 | 0.635 | 0.364 | 9.4 | 0.700 | 0.004 | 0.296 |
| 8 | CASN-1 | $CaAlSiN_3$:Eu | 646 | 95 | 0.640 | 0.358 | 14.2 | 0.000 | 0.004 | 0.996 |

As shown in FIGS. 5 and 6, the fluorescent material 3 (LAG) having a composition represented by the formula (1), the fluorescent material 4 (β-SiAlON) having a composition represented by the formula (3), the fluorescent material 5 (chlorosilicate) having a composition represented by the formula (2), and the fluorescent materials 6, 7, and 8 (SCASN-1, SCASN-2, and CASN-1) each having a composition represented by the formula (4) had a light emission peak wavelength in the wavelength range of 507 nm or more, which was the peak wavelength of the scotopic standard spectral luminous efficiency.

As shown in FIG. 5, the fluorescent material 1 (BSiON) serving as a nitride fluorescent material and the fluorescent material 2 (SAE) serving as an aluminate fluorescent material had a light emission peak wavelength in the wavelength range of 507 nm or less, which was the peak wavelength of the scotopic standard spectral luminous efficiency.

wavelength conversion member-forming composition was used to form a wavelength conversion member.

Example 3

A light emitting device according to the first embodiment was produced in the same manner as in Example 1 except that a wavelength conversion member-forming composition containing 10 parts by mass of the fluorescent material 5 (chlorosilicate) having a composition represented by the formula (2) relative to 100 parts by mass of a silicone resin serving as a translucent material was prepared, and the wavelength conversion member-forming composition was used to form a wavelength conversion member.

Example 4

A light emitting device according to the first embodiment was produced in the same manner as in Example 1 except that a light emitting element using a nitride-based semiconductor having a dominant wavelength of 494 nm was used, a wavelength conversion member-forming composition containing 1 part by mass of the fluorescent material 6 (SCASN-1) having a composition represented by the formula (4) relative to 100 parts by mass of a silicone resin serving as a translucent material was prepared, and the wavelength conversion member-forming composition was used to form a wavelength conversion member.

Example 5

A light emitting device according to the first embodiment was produced in the same manner as in Example 4 except that a wavelength conversion member-forming composition containing 2 parts by mass of the fluorescent material 7 (SCASN-2) having a composition represented by the formula (4) relative to 100 parts by mass of a silicone resin serving as a translucent material was prepared, and the wavelength conversion member-forming composition was used to form a wavelength conversion member.

Example 6

A light emitting device according to the first embodiment was produced in the same manner as in Example 4 except that a wavelength conversion member-forming composition containing 2 parts by mass of the fluorescent material 8 (CASN-1) having a composition represented by the formula (4) relative to 100 parts by mass of a silicone resin serving as a translucent material was prepared, and the wavelength conversion member-forming composition was used to form a wavelength conversion member.

Comparative Example 1

A light emitting device according to the first embodiment was produced in the same manner as in Example 1 except that a light emitting element using a nitride-based semiconductor having a dominant wavelength of 449 nm was prepared and used, a silicone resin was used as the translucent material, and a sealing member containing no fluorescent material was used instead of the wavelength conversion member.

Comparative Example 2

A light emitting device according to the first embodiment was produced in the same manner as in Example 1 except that a silicone resin was used as the translucent material, and a sealing member containing no fluorescent material was used instead of the wavelength conversion member.

Comparative Example 3

A light emitting device according to the first embodiment was produced in the same manner as in Example 1 except that a light emitting element using a nitride-based semiconductor having a dominant wavelength of 494 nm was prepared and used, a silicone resin was used as the translucent material, and a sealing member containing no fluorescent material was used instead of the wavelength conversion member.

Comparative Example 4

A light emitting device according to the first embodiment was produced in the same manner as in Example 1 except that a light emitting element using a nitride-based semiconductor having a dominant wavelength of 449 nm was prepared and used, a wavelength conversion member-forming composition containing 45 parts by mass of the fluorescent material 1 (BSiON) serving as a nitride fluorescent material relative to 100 parts by mass of a silicone resin serving as a translucent material was prepared, and the wavelength conversion member-forming composition was used to form a wavelength conversion member.

Comparative Example 5

A light emitting device according to the first embodiment was produced in the same manner as in Example 1 except that a light emitting element using a nitride-based semiconductor having a dominant wavelength of 449 nm was prepared and used, a wavelength conversion member-forming composition containing 80 parts by mass of the fluorescent material 2 (SAE) serving as an aluminate fluorescent material relative to 100 parts by mass of a silicone resin serving as a translucent material was prepared, and the wavelength conversion member-forming composition was used to form a wavelength conversion member.

Evaluations of Light Emitting Element
Chromaticity Coordinates ($x_E$, $y_E$) and Radiant Flux of Light Emitting Element For the light emitting element used in each of Examples and Comparative Examples, the chromaticity coordinates ($x_E$, $y_E$) in the chromaticity coordinate system of the CIE 1931 chromaticity diagram and the radiant flux Fa were determined using an optical measurement system combining a spectrophotometer (PMA-11, manufactured by Hamamatsu Photonics K.K.) and an integral sphere.

Dominant Wavelength of Light Emitting Element

As for the dominant wavelength of the light emitting element used in each of Examples and Comparative Examples, the chromaticity coordinates (x=0.3333, y=0.3333) of white light and the chromaticity coordinates ($x_E$, $y_E$) of the light emission color of each light emitting element in the CIE 1931 chromaticity diagram were connected by a straight line, and the wavelength at the intersection of the extension line thereof and the spectrum locus was determined as the dominant wavelength. The results are shown in Table 2.

Evaluations of Light Emitting Device
Chromaticity Coordinates ($x_D$, $y_D$), Luminous Flux, and Radiant Flux Fb of Light Emitting Device For the light emitting device used in each of Examples and Comparative Examples, the chromaticity coordinates ($x_D$, $y_D$) in the chromaticity coordinate system of the CIE 1931 chromaticity diagram, the luminous flux, and the radiant flux (spectral total radiant flux) were determined using an optical measurement system combining a spectrophotometer (PMA-11, manufactured by Hamamatsu Photonics K.K.) and an integral sphere. The chromaticity coordinates ($x_D$, $y_D$) of each light emitting device are shown in Table 2. The radiant flux Fb of each light emitting device is shown in Table 3.

Dominant Wavelength of Light Emitting Device

As for the dominant wavelength of the light emitting device used in each of Examples and Comparative Examples, the chromaticity coordinates (x=0.3333, y=0.3333) of white light and the chromaticity coordinates ($x_D$, $y_D$) of the light emission color of each light emitting device in the CIE 1931 chromaticity diagram were connected by a straight line, and the wavelength at the intersection of the extension line thereof and the spectrum locus was determined as the dominant wavelength. The results are shown in Table 2.

Relative Luminous Flux of Light Emitting Device

The relative value of the luminous flux of the light emitting device in each of Examples 1 to 6 and Comparative Examples 2 to 5 was determined as the relative luminous flux, when the luminous flux in Comparative Example 1 was set to 100%. The results are shown in Table 2.

S/P Ratio

For the light emitting device in each of Examples and Comparative Examples, the S/P ratio, which was the ratio of the luminous flux in scotopic vision to the luminous flux in photopic vision, was calculated based on the calculation formula (i). The S/P ratio is shown in Table 2.

Measurement of Light Emission Spectrum of Light Emitting Device

For the light emitting device in each of Examples and Comparative Examples, the light emission spectrum at room temperature (25° C.±5° C.) was measured using an optical measurement system combining a spectrophotometer (PMA-11, Hamamatsu Photonics K.K.) and an integral sphere. For each light emitting device, the maximum light emitting intensity was set to 1 in the light emitting spectrum of each light emitting device, and the relative light emission spectrum was determined. FIG. 7 shows a relative light emission spectrum of the light emitting device in each of Examples 1 to 3. FIG. 8 shows a relative light emission spectrum of the light emitting device in each of Examples 4 to 6. FIG. 9 shows a relative light emission spectrum of the light emitting device in each of Comparative Examples 1 to 5.

Integrated Value Ratio Ib/Ia of Light Emission Intensity

In the relative light emission spectrum of the light emitting device in each of Examples and Comparative Examples, the integrated value ratio Ib/Ia of the integrated value Ib in a wavelength range of 380 nm or more and 531 nm or less relative to the integrated value Ia in a wavelength range of 380 nm or more and 780 nm or less was determined. The results are shown in Table 3.

Light Emission Peak Wavelength and Light Emission Intensity a of Light Emitting Element in Light Emission Spectrum of Light Emitting Device In the light emission spectrum of the light emitting device in each of Examples and Comparative Examples, the peak wavelength on the shorter wavelength side than the peak wavelength of the fluorescent material was determined as a light emission peak wavelength of the light emitting element in the light emission spectrum of the light emitting device, and the light emission intensity at this light emission peak wavelength was designated as a light emission intensity a of the light emission peak wavelength of the light emitting element in the light emission spectrum of the light emitting device. The results are shown in Table 3.

Light Emission Intensity b of Light Emission Peak Wavelength of Fluorescent Material in Light Emission Spectrum of Light Emitting Device In the light emission spectrum of the light emitting device in each of Examples and Comparative Examples, the light emission intensity at the light emission peak wavelength of each fluorescent material used in the light emitting device was determined as a light emission intensity b of the light emission peak wavelength of the fluorescent material in the light emitting device. The results are shown in Table 3.

Light Emission Intensity Ratio a/b

The light emission intensity ratio a/b of the light emission intensity a of the light emission peak wavelength of the light emitting element in the light emission spectrum of the light emitting device to the light emission intensity b of the light emission peak wavelength of the fluorescent material in the light emission spectrum of the light emitting device was determined. The results are shown in Table 3.

Radiant Flux Ratio Fb/Fa

The radiant flux ratio Fb/Fa of the radiant flux Fb of the light emitting device to the radiant flux Fa of the light emitting element was determined. The results are shown in Table 3.

TABLE 2

| | Light emitting element | | Fluorescent | | Light emitting device characteristics | | | |
| | Dominant wavelength | Fluorescent | material Content | Chromaticity coordinates | | Dominant wavelength | S/P | Relative luminous |
| | (nm) | material | (%) | $x_0$ | $y_0$ | (nm) | ratio | flux (%) |
|---|---|---|---|---|---|---|---|---|
| Example 1 | 483 | LAG | 30 | 0.183 | 0.342 | 492 | 5.1 | 587 |
| Example 2 | 483 | β SiAlON | 20 | 0.159 | 0.358 | 494 | 4.7 | 540 |
| Example 3 | 483 | Chlorosilicate | 10 | 0.127 | 0.336 | 492 | 5.9 | 533 |
| Example 4 | 494 | SCASN-1 | 1 | 0.131 | 0.391 | 495 | 6.1 | 485 |
| Example 5 | 494 | SCASN-2 | 2 | 0.138 | 0.395 | 496 | 6.0 | 479 |
| Example 6 | 494 | CASN-1 | 2 | 0.108 | 0.393 | 495 | 6.4 | 474 |
| Comparative Example 1 | 449 | — | — | 0.159 | 0.019 | 449 | 25.5 | 100 |
| Comparative Example 2 | 483 | — | — | 0.097 | 0.186 | 483 | 10.0 | 329 |
| Comparative Example 3 | 494 | — | — | 0.074 | 0.387 | 494 | 6.9 | 482 |
| Comparative Example 4 | 449 | BSiON | 45 | 0.093 | 0.344 | 492 | 6.5 | 406 |
| Comparative Example 5 | 449 | SAE | 80 | 0.148 | 0.336 | 492 | 4.8 | 756 |

TABLE 3

| | Integrate value ratio of light emission intensity in light emission spectrum Ib/Ia | Light emitting element Light emission peak wavelength (nm) | Fluorescent material Light emission peak wavelength (nm) | Light emission intensity of light emission peak wavelength of light emitting element in light emitting device a | Light emission intensity of light emission peak wavelength of fluorescent material in light emitting device b | Light emission intensity ratio a/b | Radiant flux (mW) | Radiant flux ratio Fb/Fa |
|---|---|---|---|---|---|---|---|---|
| Example 1 | 0.78 | 480 | 544 | 0.97 | 0.11 | 8.99 | 87 | 0.96 |
| Example 2 | 0.79 | 480 | 530 | 0.99 | 0.28 | 3.57 | 74 | 0.82 |
| Example 3 | 0.86 | 480 | 522 | 0.96 | 0.18 | 5.22 | 86 | 0.96 |
| Example 4 | 0.88 | 492 | 626 | 1.00 | 0.03 | 30.22 | 80 | 0.97 |
| Example 5 | 0.85 | 492 | 633 | 1.00 | 0.04 | 28.94 | 80 | 0.97 |
| Example 6 | 0.89 | 492 | 646 | 1.00 | 0.02 | 43.66 | 81 | 0.98 |
| Comparative Example 1 | 0.99 | 443 | — | — | — | — | 144 | — |
| Comparative Example 2 | 0.99 | 480 | — | — | — | — | 90 | — |
| Comparative Example 3 | 0.96 | 492 | — | — | — | — | 82 | — |
| Comparative Example 4 | 0.96 | 443 | 493 | 0.21 | 1.00 | 0.21 | 69 | 0.48 |
| Comparative Example 5 | 0.84 | 443 | 495 | 0.29 | 0.99 | 0.29 | 106 | 0.74 |

The light emitting devices according to Examples 1 to 6 had a high relative luminous flux of 450% or more and an S/P ratio of 6.5 or less. Further, in the light emitting devices according to Examples 1 to 6, the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was in the range of 0.6 or more and 0.95 or less. This was considered to be due to an increase in the integrated value range of the light emission spectrum of the light emitting device, which overlapped with the integrated value range of the photopic standard spectral luminous efficiency V(λ), by combining a fluorescent material having a light emission peak wavelength at 507 nm or more, which was the peak wavelength of the scotopic standard spectral luminous efficiency, and a light emitting element having a dominant wavelength in the range of 430 nm or more and 500 nm or less.

In the light emitting devices according to Examples 1 to 6, the radiant flux ratio Fb/Fa of the radiant flux Fb of the light emitting device to the radiant flux Fa of the light emitting element was large as 0.75 or more, so that the wavelength of the light emitted from the light emitting element was efficiently converted by the fluorescent material contained in the wavelength conversion member.

Further, in the light emission spectra of the light emitting devices according to Examples 1 to 6, the light emission intensity ratio a/b of the light emission intensity a of the light emission peak wavelength of the light emitting element to the light emission intensity b of the light emission peak wavelength of the fluorescent material was large as 3.0 or more, so that the light emitted from the light emitting element was stronger than the light wavelength-converted by the fluorescent material, and desired light having a dominant wavelength in the wavelength range from blue to green including bluish-green was emitted from the light emitting device.

In the light emitting devices according to Examples 1 to 6, desired light having a dominant wavelength in the wavelength range from blue to green including bluish-green was emitted from the light emitting device according to the result of the light emission intensity ratio a/b in the light emission spectrum of the light emitting device, and excellent visibility that was bright in both scotopic vision and photopic vision was maintained according to the results of the relative luminous flux and the radiant flux ratio Fb/Fa.

Further, it was confirmed that the light emitting devices according to Examples 1 to 6 emitted light with reduced glare perceived by humans even in both scotopic vision and photopic vision according to the results of the S/P ratio and the integrated value ratio Ib/Ia.

As shown in FIGS. 7 and 8, in the light emission spectra of the light emitting devices according to Examples 1 to 6, the integrated value range of the light emission spectrum was increased in a range overlapping with the integral value range of the photopic standard spectral luminous efficiency V (λ).

The light emitting devices according to Comparative Examples 1 to 3 had an S/P ratio of more than 6.5.

Further, since the light emitting devices according to Comparative Examples 1 to 3 contained no fluorescent material, the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was large as more than 0.95. This was considered to be due to the fact that the integrated value range of the light emission spectrum of the light emitting device overlapping with the integral value range of the photopic standard spectral luminous efficiency V (λ) was small since no fluorescent material was contained. Since the light emitting devices according to Comparative Examples 1 to 3 had an S/P ratio of more than 6.5, there was a difference in the brightness perceived by the human eye in a bright place and a dark place, and the light emitted from the light emitting device having a dominant wavelength in the wavelength range from blue to green including bluish-green could be perceived as glaring in a dark place.

The light emitting device according to Comparative Example 4 had an S/P ratio of 6.5. However, the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was large as more than 0.95. This was considered to be due to the fact that the integrated value range of the light emission spectrum of the light emitting device overlapping with the integral value range of the photopic standard spectral luminous efficiency V (λ) was small since the fluorescent material contained in the light emitting device had a light emission peak wavelength smaller than 507 nm, which was the peak wavelength of the scotopic standard spectral luminous efficiency. In the light emitting device according to Comparative Example 4, the light emitted from the light emitting device having a dominant wavelength in the wavelength range from blue to green including bluish-green could be perceived as glaring in a dark place. Further, in the light emitting device according to Comparative Example 4, the radiant flux ratio Fb/Fa of the radiant flux Fb of the light emitting device to the radiant flux Fa of the light emitting element was 0.75 or less, so that the wavelength conversion efficiency of the fluorescent material excited by the light emitted from the light emitting element was low, and excellent visibility was not be maintained.

In the light emitting device according to Comparative Example 5, the S/P ratio was 6.5 or less and the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was 0.95 or less. However, the radiant flux ratio Fb/Fa of the radiant flux Fb of the light emitting device to the radiant flux Fa of the light emitting element was low as 0.74, so that the wavelength conversion efficiency of the fluorescent material was not good. Further, in the light emitting device according to Comparative Example 5, the light emission intensity ratio a/b in the light emission spectrum of the light emitting device was small as 0.29, so that the light emitted from the light emitting element was weaker than the light wavelength-converted by the fluorescent material, and excellent visibility was not be maintained.

As shown in FIG. 9, in the light emission spectra of the light emitting devices according to Comparative Examples 1 to 3, the light emission spectrum of the light emitted from the light emitting element was confirmed. However, there were few ranges overlapping with the integral value range of the photopic standard spectral luminous efficiency V (λ), and there was a difference in the brightness perceived by the human eye between bright and dark places, so that the light emitted from the light emitting device having a dominant wavelength in the wavelength range from blue to green including bluish-green could be perceived as glaring in a dark place. Also, as shown in FIG. 9, in the light emission spectra of the light emitting devices according to Comparative Examples 4 and 5, the light emission intensity ratio a/b of the light emission intensity a of the light emission peak wavelength of the light emitting element to the light emission intensity b of the light emission peak wavelength of the fluorescent material was small, and excellent visibility that was bright in both scotopic and photopic vision was not maintained.

As shown in FIG. 10, on the CIE1931 chromaticity diagram, the chromaticity coordinates $(x_D, y_D)$ of the light emission colors of the light emitting devices according to Examples 1 to 6 were all within the target color tone range (area A), and the light emission colors of the target color tone were obtained.

As shown in FIG. 11, on the CIE1931 chromaticity diagram, the chromaticity coordinates $(x_D, y_D)$ of the light emission colors of the light emitting devices according to Comparative Examples 3 to 5 were within the target color tone range (area A), and the light emission colors of the target color tone were obtained. However, the chromaticity coordinates $(x_D, y_D)$ of the light emission colors of the light emitting devices according to Comparative Examples 1 and 2 were out of the target color tone range (area A), and the light emission colors of the target color tone were not obtained.

Example 7

The light emitting device according to the second embodiment was produced.

In the step of arranging a light emitting element, a ceramic substrate made of aluminum nitride was used as the substrate. As the light emitting element, a light emitting element on which a nitride semiconductor layer having a dominant wavelength of 488 nm was laminated was used. The size of the light emitting element was a substantially square having a planar shape of approximately 1.0 mm square, and the thickness was approximately 0.11 mm. The light emitting element was arranged such that the light emitting surface was on the substrate side, and was flip-chip mounted by bumps using a conductive member made of Au. The semiconductor element was flip-chip mounted by bumps using a conductive member made of Au at an interval from the light emitting element.

In the step of forming a wavelength conversion body including a wavelength conversion member, a wavelength conversion member-forming composition containing 46 parts by mass of the fluorescent material 3 (LAG) having a composition represented by the formula (1), 5 parts by mass of aluminum oxide as a filler, and 30 parts by mass of spherical silica having an average particle diameter of 11 μm (catalog value) for stabilizing the shape, relative to 100 parts by mass of a silicone resin serving as a translucent material, was prepared. As the translucent body, a translucent body made of borosilicate glass, in which the shape was a substantially square having a planar shape of approximately 1.15 mm square, which was approximately 0.15 mm larger in length and width than the planar shape of the light emitting element, and the thickness was approximately 0.10 mm, was prepared. The wavelength conversion member-forming composition was printed on one surface of the translucent body having a substantially square shape by a printing method, and was cured by heating at 150° C. for 3 hours to form a layered wavelength conversion member having a thickness of approximately 80 μm, thereby forming a wavelength conversion body in which the layered wavelength conversion member and the translucent body were integrated.

In the step of adhering a light emitting element and a wavelength conversion member, one surface of the wavelength conversion member having a substantially square with a planer shape of approximately 1.15 mm square and one surface of the light emitting element having a substantially square with a planer shape of approximately 1.0 mm square were adhered together using an adhesive containing a silicone resin, thereby forming an adhesive layer between the light emitting element and the wavelength conversion member. Since the adhering surface of the wavelength conversion member with the light emitting element was approximately 0.15 mm larger in length and width than the adhering surface of the light emitting element, the adhesive protruding from the adhering surface of the light emitting element adhered to the side surface of the light emitting element to form a protruding portion of the adhesive layer having a substantially triangular vertical cross-sectional shape. The protruding portion of the adhesive layer adhering to the side surface of the light emitting element had a triangular shape in which the thickness of the layer decreased toward the lower side of the light emitting element, and had an inclination extending toward the upper wavelength conversion member side.

In the step of forming a covering member, a covering member-forming composition containing a dimethyl silicone resin and titanium oxide particles having an average particle diameter of 0.28 μm (catalog value), in which the amount of the titanium oxide particles was 30 parts by mass relative to 100 parts by mass of the dimethyl silicone resin, was prepared. The covering member-forming composition was filled such that the light emitting element arranged on the substrate and the side surface of the wavelength conversion body including the wavelength conversion member and the translucent body were covered with the covering member-forming composition, and the semiconductor element was completely embedded in the covering member-forming composition. The covering member-forming composition was then cured to form a covering member and a resin package, thereby producing a light emitting device according to the second embodiment.

Example 8

A light emitting device according to the second embodiment was produced in the same manner as in Example 7 except that a wavelength conversion member-forming composition containing 60 parts by mass of the fluorescent material 4 (β-SiAlON) having a composition represented by the formula (3) and 5 parts by mass of aluminum oxide as a filler, relative to 100 parts by mass of a silicone resin serving as a translucent material was prepared and used.

Example 9

A light emitting device according to the second embodiment was produced in the same manner as in Example 7 except that a wavelength conversion member-forming composition containing 23 parts by mass of the fluorescent material 5 (chlorosilicate) having a composition represented by the formula (2), 5 parts by mass of aluminum oxide as a filler, and 30 parts by mass of spherical silica having an average particle diameter of 11 μm (catalog value) for stabilizing the shape, relative to 100 parts by mass of a silicone resin serving as a translucent material, was prepared and used.

Example 10

A light emitting device according to the second embodiment was produced in the same manner as in Example 7 except that as the light emitting element, a light emitting element on which a nitride semiconductor layer having a dominant wavelength of 495 nm was laminated was used.

Example 11

A light emitting device according to the second embodiment was produced in the same manner as in Example 8 except that as the light emitting element, a light emitting element on which a nitride semiconductor layer having a dominant wavelength of 495 nm was laminated was used.

Example 12

A light emitting device according to the second embodiment was produced in the same manner as in Example 9 except that as the light emitting element, a light emitting element on which a nitride semiconductor layer having a dominant wavelength of 495 nm was laminated was used.

Example 13

A light emitting device according to the second embodiment was produced in the same manner as in Example 7 except that as the light emitting element, a light emitting element on which a nitride semiconductor layer having a dominant wavelength of 495 nm was laminated was used, and a wavelength conversion member-forming composition containing 4 parts by mass of the fluorescent material 6 (SCASN-1) having a composition represented by the formula (4), 5 parts by mass of aluminum oxide as a filler, and 30 parts by mass of spherical silica having an average particle diameter of 11 μm (catalog value), relative to 100 parts by mass of a silicone resin serving as a translucent material, was used.

Comparative Example 6

A light emitting device according to the second embodiment including a light diffusing member instead of the wavelength conversion member was produced in the same manner as in Example 7 except that a light emitting element using a nitride semiconductor having a dominant wavelength of 449 nm was used, a light diffusing member-forming composition containing 10 parts by mass of aluminum oxide as a filler relative to 100 parts by mass of a silicone resin as a translucent material was prepared instead of the wavelength conversion member-forming composition, the light diffusing member-forming composition was coated on a translucent body having a thickness of approximately 0.15 mm want to form a layered light diffusing member having a thickness of approximately 35 μm, and the light diffusing member and the light emitting element were adhered together.

Comparative Example 7

A light emitting device according to the second embodiment including a light diffusing member instead of the wavelength conversion member was produced in the same manner as in Comparative Example 6 except that a light emitting element using a nitride semiconductor having a dominant wavelength of 488 nm was used.

Comparative Example 8

A light emitting device according to the second embodiment including a light diffusing member instead of the wavelength conversion member was produced in the same manner as in Comparative Example 6 except that a light emitting element using a nitride semiconductor having a dominant wavelength of 492 nm was used.

Comparative Example 9

A light emitting device according to the second embodiment including a light diffusing member instead of the wavelength conversion member was produced in the same manner as in Comparative Example 6 except that a light emitting element using a nitride semiconductor having a dominant wavelength of 495 nm was used.

Comparative Example 10

A light emitting device according to the second embodiment was produced in the same manner as in Example 7 except that a light emitting element using a nitride semiconductor having a dominant wavelength of 449 nm was used, and a wavelength conversion member-forming composition containing 150 parts by mass of the fluorescent material 1 (BSiON) serving as a nitride fluorescent material and 20 parts by mass of aluminum oxide as a filler, relative to 100 parts by mass of a silicone resin serving as a translucent material, was used.

Comparative Example 11

A light emitting device according to the second embodiment was produced in the same manner as in Example 7 except that a light emitting element using a nitride semiconductor having a dominant wavelength of 449 nm was used, and a wavelength conversion member-forming composition containing 150 parts by mass of the fluorescent material 2 (SAE) serving as an aluminate fluorescent material and 20 parts by mass of aluminum oxide as a filler, relative to 100 parts by mass of a silicone resin serving as a translucent material, was used.

Evaluations of Light Emitting Element

The chromaticity coordinates $(x_E, y_E)$, the radiant flux, and the dominant wavelength of the light emitting element used in Examples 7 to 13 and Comparative Examples 6 to 11 were determined in the same manner as in the light emitting element used in Example 1.

For the light emitting device according to Examples 7 to 13 and Comparative Examples 6 to 11, the chromaticity coordinates $(x_D, y_D)$, the luminous flux, the radiant flux Fb, the dominant wavelength, the relative luminous flux, the S/P ratio, the light emission spectrum, the integrated value ratio Ib/Ia, the light emission peak wavelength and light emission intensity a of the light emitting element in the light emission spectrum of the light emitting device, the light emission intensity b of the light emission peak wavelength of the fluorescent material in the light emission spectrum of the light emitting device, the light emission intensity ratio a/b, and the radiant flux ratio Fb/Fa were determined in the same manner as in Example 1. The relative value of the luminous flux of the light emitting device in each of Examples 7 to 13 and Comparative Examples 7 to 11 was determined as the relative luminous flux, when the luminous flux in Comparative Example 6 was set to 100%. The results are shown in Tables 4 and 5. FIG. 12 shows a relative light emission spectrum of each of the light emitting devices according to Examples 7 to 9. FIG. 13 shows a relative light emission spectrum of each of the light emitting devices according to Examples 10 to 13. FIG. 14 shows a relative light emission spectrum of each of the light emitting devices according to Comparative Examples 6 to 11.

TABLE 4

| | Light emitting element Dominant wavelength (nm) | Fluorescent material | Fluorescent material Content (%) | Light emitting device characteristics | | | | |
|---|---|---|---|---|---|---|---|---|
| | | | | Chromaticity coordinates | | Dominant wavelength (nm) | S/P ratio | Relative luminous flux (%) |
| | | | | $x_0$ | $y_0$ | | | |
| Example 7 | 488 | LAG | 46 | 0.148 | 0.375 | 495 | 5.7 | 659 |
| Example 8 | 488 | β SiAlON | 60 | 0.132 | 0.391 | 495 | 5.3 | 654 |
| Example 9 | 488 | Chlorosilicate | 23 | 0.105 | 0.376 | 494 | 6.2 | 631 |
| Example 10 | 495 | LAG | 46 | 0.131 | 0.424 | 498 | 5.6 | 659 |
| Example 11 | 495 | β SiAlON | 60 | 0.124 | 0.449 | 499 | 5.1 | 664 |
| Example 12 | 495 | Chlorosilicate | 23 | 0.095 | 0.425 | 497 | 6.1 | 639 |
| Example 13 | 495 | SCASN-1 | 4 | 0.176 | 0.350 | 493 | 5.9 | 534 |
| Comparative Example 6 | 449 | — | — | 0.159 | 0.019 | 449 | 24.9 | 100 |
| Comparative Example 7 | 488 | — | — | 0.082 | 0.267 | 488 | 8.5 | 479 |
| Comparative Example 8 | 492 | — | — | 0.075 | 0.337 | 492 | 7.6 | 524 |
| Comparative Example 9 | 495 | — | — | 0.071 | 0.403 | 495 | 6.8 | 581 |
| Comparative Example 10 | 449 | BSiON | 150 | 0.080 | 0.411 | 496 | 6.3 | 303 |
| Comparative Example 11 | 449 | SAE | 220 | 0.145 | 0.294 | 489 | 5.2 | 683 |

Evaluations of Light Emitting Device

TABLE 5

| | Integrated value ratio of light emission intensity in light emission spectrum Ib/Ia | Light emitting element Light emission Peak wavelength (nm) | Fluorescent material Light emission peak wavelength (nm) | Light emission intensity of light emission peak wavelength of light emitting element in light emitting device a | Light emission intensity of light emission peak wavelength of fluorescent material in light emitting device b | Light emission intensity ratio a/b | Radiant flux (mW) | Radiant flux ratio Fb/Fa |
|---|---|---|---|---|---|---|---|---|
| Example 7 | 0.85 | 486 | 544 | 0.96 | 0.07 | 13.8 | 929 | 0.96 |
| Example 8 | 0.85 | 486 | 530 | 1.00 | 0.20 | 5.0 | 839 | 0.86 |
| Example 9 | 0.91 | 486 | 522 | 0.98 | 0.16 | 6.1 | 912 | 0.94 |

TABLE 5-continued

| | Integrated value ratio of light emission intensity in light emission spectrum Ib/Ia | Light emitting element Light emission Peak wavelength (nm) | Fluorescent material Light emission peak wavelength (nm) | Light emission intensity of light emission peak wavelength of light emitting element in light emitting device a | Light emission intensity of light emission peak wavelength of fluorescent material in light emitting device b | Light emission intensity ratio a/b | Radiant flux (mW) | Radiant flux ratio Fb/Fa |
|---|---|---|---|---|---|---|---|---|
| Example 10 | 0.87 | 492 | 544 | 1.00 | 0.08 | 15.3 | 879 | 0.99 |
| Example 11 | 0.86 | 492 | 530 | 1.00 | 0.22 | 4.5 | 796 | 0.90 |
| Example 12 | 0.92 | 492 | 522 | 1.00 | 0.19 | 5.4 | 869 | 0.98 |
| Example 13 | 0.81 | 492 | 626 | 0.99 | 0.07 | 15.0 | 842 | 0.96 |
| Comparative Example 6 | 1.00 | 444 | — | — | — | — | 1347 | — |
| Comparative Example 7 | 0.98 | 486 | — | — | — | — | 971 | — |
| Comparative Example 8 | 0.97 | 491 | — | — | — | — | 912 | — |
| Comparative Example 9 | 0.96 | 492 | — | — | — | — | 888 | — |
| Comparative Example 10 | 0.96 | 444 | 493 | 0.07 | 1.00 | 0.1 | 422 | 0.31 |
| Comparative Example 11 | 0.86 | 444 | 495 | 0.48 | 0.98 | 0.5 | 932 | 0.69 |

The light emitting devices according to Examples 7 to 13 had a high relative luminous flux of 500% or more and an S/P ratio of 6.5 or less. Further, in the light emitting devices according to Examples 7 to 13, the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was in the range of 0.6 or more and 0.95 or less. This was considered to be due to an increase in the integrated value range of the light emission spectrum of the light emitting device, which overlapped with the integrated value range of the photopic standard spectral luminous efficiency V (λ), by combining a fluorescent material having a light emission peak wavelength at 507 nm or more, which was the peak wavelength of the scotopic standard spectral luminous efficiency, and a light emitting element having a dominant wavelength in the range of 430 nm or more and 500 nm or less.

In the light emitting devices according to Examples 7 to 13, the radiant flux ratio Fb/Fa of the radiant flux Fb of the light emitting device to the radiant flux Fa of the light emitting element was large as 0.75 or more, so that the wavelength conversion efficiency of the light emitted from the light emitting element was higher by the fluorescent material contained in the wavelength conversion member.

Further, in the light emission spectra of the light emitting devices according to Examples 7 to 13, the light emission intensity ratio a/b of the light emission intensity a of the light emission peak wavelength of the light emitting element to the light emission intensity b of the light emission peak wavelength of the fluorescent material was large as 3.0 or more, so that the light emitted from the light emitting element was stronger than the light wavelength-converted by the fluorescent material, and desired light having a dominant wavelength in the wavelength range from blue to green including bluish-green was emitted from the light emitting device.

In the light emitting devices according to Examples 7 to 13, desired light having a dominant wavelength in the wavelength range from blue to green including bluish-green was emitted from the light emitting device according to the result of the light emission intensity ratio a/b, and excellent visibility that was bright in both scotopic vision and photopic vision was maintained according to the results of the relative luminous flux and the radiant flux ratio Fb/Fa.

Further, it was confirmed that the light emitting devices according to Examples 7 to 13 emitted light with reduced glare perceived by humans even in both scotopic vision and photopic vision according to the results of the S/P ratio and the integrated value ratio Ib/Ia.

As shown in FIGS. 12 and 13, in the light emission spectra of the light emitting devices according to Examples 7 to 13, the integrated value range of the light emission spectrum was increased in a range overlapping with the integral value range of the photopic standard spectral luminous efficiency V (λ).

The light emitting devices according to Comparative Examples 6 to 9 had an S/P ratio of more than 6.5.

Further, since the light emitting devices according to Comparative Examples 6 to 9 used the light diffusing member containing no fluorescent material instead of the wavelength conversion member containing a fluorescent material, the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was large as more than 0.95. This was considered to be due to the fact that the integrated value range of the light emission spectrum of the light emitting device overlapping with the integral value range of the photopic standard spectral luminous efficiency V (λ) was small since no fluorescent material was contained. Since the light emitting devices according to Comparative Examples 6 to 9 had an S/P ratio of more than 6.5, there was a difference in the brightness perceived by the human eye in a bright place and a dark place, and the light emitted from the light emitting device having a dominant wavelength in the wavelength range from blue to green including bluish-green could be perceived as glaring in a dark place.

The light emitting device according to Comparative Example 10 had an S/P ratio of 6.5 or less. However, the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was large as more than 0.95. This was considered to be due to the fact that the integrated value range of the light emission spectrum of the light emitting device overlapping with the integral value range of the photopic standard spectral luminous efficiency V (λ) was small since the fluorescent material contained in the light emitting device had a light emission peak wavelength smaller than 507 nm, which was the peak wavelength of the scotopic standard spectral luminous efficiency. In the light emitting device according to Comparative Example 10, the light emitted from the light emitting device having a dominant wavelength in the wavelength range from blue to green including bluish-green could be perceived as glaring in a dark place. Further, in the light emitting device according to Comparative Example 10, the radiant flux ratio Fb/Fa of the radiant flux Fb of the light emitting device to the radiant flux Fa of the light emitting element was small as 0.31, and the light emission intensity ratio a/b in the light emission spectrum of the light emitting device was 0.1, which was smaller than 1.0, so that the wavelength conversion efficiency of the fluorescent material excited by the light emitted from the light emitting element was low. The light emitting device according to Comparative Example 10 required a larger amount of fluorescent material than in Examples in order to lower the S/P ratio and ensure excellent visibility.

In the light emitting device according to Comparative Example 11, the S/P ratio was 6.5 or less and the integrated value ratio Ib/Ia of the integrated value Ib in the wavelength range of 380 nm or more and 531 nm or less to the integrated value Ia in the wavelength range of 380 nm or more and 780 nm or less in the light emission spectrum of the light emitting device was 0.95 or less. However, the radiant flux ratio Fb/Fa of the radiant flux Fb of the light emitting device to the radiant flux Fa of the light emitting element was low as 0.69, so that the wavelength conversion efficiency of the fluorescent material was not good. Further, in the light emitting device according to Comparative Example 11, the light emission intensity ratio a/b in the light emission spectrum was 0.5, which was smaller than 1.0, so that the wavelength conversion efficiency of the fluorescent material excited by the light emitted from the light emitting element was low. The light emitting device according to Comparative Example 11 required a larger amount of fluorescent material than in Examples in order to lower the S/P ratio and ensure excellent visibility.

As shown in FIG. 14, in the light emission spectra of the light emitting devices according to Comparative Examples 6 to 9, the light emission spectrum of the light emitted from the light emitting element was confirmed. However, there were few ranges overlapping with the integral value range of the photopic standard spectral luminous efficiency V (λ), and there was a difference in the brightness perceived by the human eye between bright and dark places, so that the light emitted from the light emitting device having a dominant wavelength in the wavelength range from blue to green including bluish-green could be perceived as glaring in a dark place. Also, as shown in FIG. 14, in the light emission spectra of the light emitting devices according to Comparative Examples 10 and 11, the light emission intensity ratio a/b of the light emission intensity a of the light emission peak wavelength of the light emitting element to the light emission intensity b of the light emission peak wavelength of the fluorescent material was small.

As shown in FIG. 15, on the CIE1931 chromaticity diagram, the chromaticity coordinates ($x_D$, $y_D$) of the light emission colors of the light emitting devices according to Examples 7 to 13 were all within the target color tone range (area A), and the light emission colors of the target color tone were obtained.

As shown in FIG. 16, on the CIE1931 chromaticity diagram, the chromaticity coordinates ($x_D$, $y_D$) of the light emission colors of the light emitting devices according to Comparative Examples 8 to 10 were within the target color tone range (area A), and the light emission colors of the target color tone were obtained. However, the chromaticity coordinates ($x_D$, $y_D$) of the light emission colors of the light emitting devices according to Comparative Examples 6, 7 and 11 were out of the target color tone range (area A), and the light emission colors of the target color tone were not obtained.

INDUSTRIAL APPLICABILITY

The light emitting device according to the embodiment of the present invention can be utilized as a light emitting device for general illumination, a light emitting device for vehicles, a display device, an illumination fixture, a display, and the like.

EXPLANATIONS OF LETTERS OR NUMERALS

11, 12: Light emitting element, 13: Semiconductor element, 21: Fluorescent material, 31, 32: Wavelength conversion member, 33: Translucent body, 34: Wavelength conversion body, 41: Molded body, 42: Resin portion, 51: First lead, 52: Second lead, 61, 62: Conductive member, 72: Substrate, 82: Adhesive layer, 92: Covering member, 100, 200: Light emitting device.

What is claimed is:

1. A light emitting device, comprising a light emitting element having a dominant wavelength in a range of 430 nm or more and 500 nm or less, and a fluorescent material that is excited by light emitted from the light emitting element and has a light emission peak wavelength in a range of 507 nm or more and 660 nm or less, the light emitting device emitting light having a dominant wavelength in a range of 490 nm or more and 500 nm or less, the light emitting device having an S/P ratio, which is the ratio of a luminous flux in scotopic vision to a luminous flux in photopic vision, being 6.5 or less, the light emitting device having a light emission intensity in a light emission peak wavelength of the light emitting element that is greater than a light emission intensity in the light emission peak wavelength of the fluorescent material, wherein the light emitting device emits light having chromaticity coordinates (x, y) within an area in the xy chromaticity coordinate system of the CIE 1931 chromaticity diagram, wherein when the chromaticity coordinates (x=0.0082, y=0.5384) is defined as a first point, the chromaticity coordinates (x=0.0454, y=0.2950) is defined as a second point, the chromaticity coordinates (x=0.2000, y=0.3200) is defined as a third point, and the chromaticity coordinates (x=0.2000, y=0.4000) is defined as a fourth point, the area is demarcated by a first straight line connecting the first point and the second point, a second straight line connecting the second point and the third point, a third straight line connecting the third point and the fourth point, and a fourth straight line connecting the fourth point and the first point.

2. The light emitting device according to claim 1, wherein the S/P ratio is 6.0 or less.

3. The light emitting device according to claim 1, wherein the S/P ratio is 2.0 or more and 6.5 or less.

4. The light emitting device according to claim 1, wherein in a light emission spectrum of the light emitting device, a ratio Ib/Ia of an integrated value Ib of the light emission spectrum in a wavelength range of 380 nm or more and 531 nm or less to an integrated value Ia of the light emission spectrum in a wavelength range of 380 nm or more and 780 nm or less is in a range of 0.6 or more and 0.95 or less.

5. The light emitting device according to claim 1, wherein in a light emission spectrum of the light emitting device, a ratio a/b of a light emission intensity a of a light emission peak wavelength of the light emitting element to a light emission intensity b of the light emission peak wavelength of the fluorescent material is 3.0 or more.

6. The light emitting device according to claim 1, wherein a Fb/Fa of a radiant flux Fb of the light emitting device to a radiant flux Fa of the light emitting element is 0.75 or more.

7. The light emitting device according to claim 1, comprising a wavelength conversion member including the fluorescent material and a translucent material, wherein the wavelength conversion member includes the fluorescent material in a range of 0.5 part by mass or more and 65 parts by mass or less relative to 100 parts by mass of the translucent material.

8. The light emitting device according to claim 1, wherein the fluorescent material has a half value width in a range of 45 nm or more and 120 nm or less.

9. The light emitting device according to claim 1, wherein the fluorescent material comprises at least one fluorescent material selected from the group consisting of a rare earth aluminate fluorescent material having a composition containing at least one element Ln selected from the group consisting of Y, La, Lu, Gd, and Tb; Ce; Al; and optionally at least one element selected from the group consisting of Ga and Sc, a β-SiAlON fluorescent material having a composition containing Si, Al, O, N, and Eu, a halosilicate fluorescent material having a composition containing Ca, Eu, Mg, Si, O, and at least one halogen element selected from the group consisting of F, Cl, and Br, and a nitride fluorescent material having a composition containing Ca, Eu, Si, Al, N, and optionally Sr.

10. The light emitting device according to claim 1, wherein the fluorescent material comprises at least one fluorescent material selected from the group consisting of a rare earth aluminate fluorescent material having a composition represented by the following formula (1), a halosilicate fluorescent material having a composition represented by the following formula (2), a β-SiAlON fluorescent material having a composition represented by the following formula (3), and a nitride fluorescent material having a composition represented by the following formula (4):

$$(Y,Lu,Gd)_3(Al,Ga)_5O_{12}:Ce \qquad (1);$$

$$(Ca,Sr,Ba)_8MgSi_4O_{16}(F,Cl,Br)_2:Eu \qquad (2);$$

$$Si_{6-z}Al_zO_zN_{8-z}:Eu, \text{ wherein } 0 \le z \le 4.2 \qquad (3); \text{ and}$$

$$(Sr,Ca)AlSiN_3:Eu \qquad (4).$$

\* \* \* \* \*